(12) United States Patent
Yokoyama et al.

(10) Patent No.: US 10,192,925 B2
(45) Date of Patent: *Jan. 29, 2019

(54) SEMICONDUCTOR DEVICE STRUCTURE USEFUL FOR BULK TRANSISTOR AND METHOD OF MANUFACTURING SAME

(71) Applicant: Sony Corporation, Tokyo (JP)

(72) Inventors: Takashi Yokoyama, Kanagawa (JP); Taku Umebayashi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/912,812

(22) Filed: Mar. 6, 2018

(65) Prior Publication Data

US 2018/0197916 A1    Jul. 12, 2018

Related U.S. Application Data

(63) Continuation of application No. 15/186,765, filed on Jun. 20, 2016, now Pat. No. 9,954,031, which is a (Continued)

(30) Foreign Application Priority Data

Sep. 2, 2013    (JP) .................................. 2013-181338

(51) Int. Cl.
| | |
|---|---|
| *H01L 27/22* | (2006.01) |
| *H01L 23/48* | (2006.01) |
| *H01L 29/78* | (2006.01) |
| *H01L 21/768* | (2006.01) |
| *H01L 27/06* | (2006.01) |

(Continued)

(52) U.S. Cl.
CPC ...... *H01L 27/228* (2013.01); *H01L 21/76898* (2013.01); *H01L 21/84* (2013.01); *H01L 21/845* (2013.01); *H01L 23/481* (2013.01); *H01L 27/0694* (2013.01); *H01L 27/1203* (2013.01); *H01L 27/1211* (2013.01); *H01L 29/785* (2013.01); *H01L 43/02* (2013.01); *H01L 43/08* (2013.01); *H01L 43/10* (2013.01); *H01L 43/12* (2013.01); *H01L 21/76897* (2013.01); *H01L 29/7833* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 9,412,788 B2 * | 8/2016 | Yokoyama et al. | .. H01L 23/481 |
| 2004/0004889 A1 | 1/2004 | Asao et al. | |

(Continued)

FOREIGN PATENT DOCUMENTS

JP    2010-171166    8/2010

*Primary Examiner* — Bilkis Jahan
(74) *Attorney, Agent, or Firm* — Dentons US LLP

(57) ABSTRACT

A semiconductor device including a semiconductor substrate with a first surface and a second surface facing each other, the semiconductor substrate having an element region in which a transistor is provided on the first surface, and a separation region in which an element separating layer surrounding the element region is provided; a contact plug extending from the first surface to the second surface, in the element region of the semiconductor substrate; and an insulating film covering a periphery of the contact plug.

15 Claims, 32 Drawing Sheets

Related U.S. Application Data continuation of application No. 14/467,865, filed on Aug. 25, 2014, now Pat. No. 9,412,788.

(51) Int. Cl.
*H01L 21/84* (2006.01)
*H01L 27/12* (2006.01)
*H01L 43/02* (2006.01)
*H01L 43/08* (2006.01)
*H01L 43/10* (2006.01)
*H01L 43/12* (2006.01)

(56) References Cited

U.S. PATENT DOCUMENTS

| | | |
|---|---|---|
| 2007/0242505 A1 | 10/2007 | Ochiai et al. |
| 2008/0160643 A1 | 7/2008 | Park et al. |
| 2010/0032779 A1 | 2/2010 | Tsukamoto et al. |
| 2010/0181547 A1* | 7/2010 | Kuroda ............... H01L 21/74 257/2 |
| 2010/0327453 A1 | 12/2010 | Kim |
| 2011/0260286 A1 | 10/2011 | Lee et al. |
| 2012/0007186 A1 | 1/2012 | Seo |
| 2012/0068283 A1 | 3/2012 | Hosotani et al. |
| 2012/0104497 A1 | 5/2012 | Denison et al. |
| 2012/0217476 A1* | 8/2012 | Ikeno ............... G11C 11/161 257/16 |
| 2013/0178048 A1* | 7/2013 | Sun ............... H01L 21/743 438/478 |
| 2013/0207112 A1* | 8/2013 | Isobe ............... H01L 27/1225 257/57 |
| 2014/0346624 A1* | 11/2014 | Shoji ............... H01L 43/12 257/421 |
| 2015/0069480 A1* | 3/2015 | Kanaya ............... H01L 27/222 257/295 |

\* cited by examiner

SEMICONDUCTOR DEVICE STRUCTURE USEFUL FOR BULK TRANSISTOR AND METHOD OF MANUFACTURING SAME

CROSS REFERENCE TO RELATED APPLICATIONS

This application is a continuation of U.S. patent application Ser. No. 15/186,765 filed Jun. 20, 2016, which is a continuation of U.S. patent application Ser. No. 14/467,865 filed Aug. 25, 2014, now U.S. Pat. No. 9,412,788 issued Aug. 9, 2016, the entireties of which are incorporated herein by reference to the extent permitted by law. This present application claims the benefit of Japanese Priority Patent Application JP2013-181338 filed Sep. 2, 2013, the entire contents of which are incorporated herein by reference.

BACKGROUND

The present disclosure relates to a semiconductor device having a structure in which an insulator layer and a semiconductor layer are laminated on a semiconductor substrate, and to a method of manufacturing the semiconductor device.

For semiconductor integrated circuits including a complementary metal oxide semiconductor (CMOS) transistor, it has been studied to achieve higher integration and a higher operating speed. In recent years, in view of low power consumption, switching from volatile memory to nonvolatile memory has been studied, and, for example, magnetoresistive random access memory (MRAM) has been developed (for example, see Japanese Unexamined Patent Application Publication No. 2010-171166 (JP2010-171166A)).

Usually, a contact electrode connected to a source-drain region of a transistor has been provided on a main-surface side, on which the transistor is formed, of a substrate. However, in recent years, it has been attempted to dispose the contact electrode on a back-surface side of the substrate. For example, JP2010-171166A has discussed as follows. According to this document, while a diffusion layer and a silicide layer of a main element are formed on a surface side of a silicon (Si) substrate, a contact electrode is disposed to extend from a back-surface side of the substrate. This contact electrode from the back-surface side is connected to the silicide layer by passing through the substrate and the diffusion layer. Such a structure increases flexibility in wiring paths and the like, which is advantageous in terms of design.

SUMMARY

However, in JP2010-171166A, since the contact electrode is formed from the back-surface side of the substrate, there is a concern about such a disadvantage that a short circuit with a gate electrode of the transistor formed on the substrate may occur, when higher integration is attempted. The short circuit may occur due to variation or alignment precision in processing. In addition, the technique of JP2010-171166A is suitable for a semiconductor transistor having a silicon-on-insulator (SOI) structure, but is not applicable to a typical semiconductor transistor having a bulk structure.

It is desirable to provide a semiconductor device being highly flexible in design and having a structure suitable for higher integration, and a method of manufacturing the semiconductor device.

According to an embodiment of the present disclosure, there is provided a semiconductor device including: a semiconductor substrate including a first surface and a second surface facing each other, the semiconductor substrate having an element region in which a transistor is provided on the first surface, and a separation region in which an element separating layer surrounding the element region is provided; a contact plug extending from the first surface to the second surface, in the element region of the semiconductor substrate; and an insulating film covering a periphery of the contact plug.

According to another embodiment of the present disclosure, there is provided a semiconductor device including: a semiconductor substrate; an element formation layer including a transistor provided on the semiconductor substrate; a contact plug passing through the element formation layer and the semiconductor substrate; and an insulating film covering a periphery of the contact plug. The element formation layer has a first layer, a fin, and a second layer, the first layer including a semiconductor portion and an insulator portion, the semiconductor portion occupying a first region extending in a first direction, the insulator portion occupying a second region excluding the first region, the fin being provided to stand on the semiconductor portion, and the second layer including a gate wiring, a source wiring, and a drain wiring that cover a surface of the fin except a back surface of the fin and extend in a second direction. The source wiring or the drain wiring is connected to one end of the contact plug.

According to still another embodiment of the present disclosure, there is provided a semiconductor device including: an insulating layer; an embedded oxide film provided on the insulating layer; an element formation layer including a transistor provided on the embedded oxide film; a contact plug passing through the element formation layer, the embedded oxide film, and a semiconductor substrate; and an insulating film covering a periphery of the contact plug. The transistor includes a fin, a gate wiring, a source wiring, and a drain wiring, the fin being provided to stand on the embedded oxide film and extending in a first direction, and the gate wiring, the source wiring, and the drain wiring each covering a surface of the fin except a back surface of the fin and extending in a second direction. The source wiring or the drain wiring is connected to one end of the contact plug.

According to an embodiment of the present disclosure, there is provided a method of manufacturing a semiconductor device. The method includes: preparing a semiconductor substrate including a first surface and a second surface facing each other, the semiconductor substrate having an element region in which a transistor is provided on the first surface, and a separation region in which an element separating layer surrounding the element region is provided; forming an insulating film covering a wall surface of a through hole, after forming the through hole by hollowing out the semiconductor substrate from the first surface towards the second surface in the element region of the semiconductor substrate; and forming a contact plug by filling the through hole covered by the insulating film, with a metallic material.

In the semiconductor devices and the method of manufacturing the semiconductor device according to the above-described respective embodiments of the present disclosure, the periphery of the contact plug passing through the semiconductor substrate is covered by the insulating film. Therefore, an unintentional short circuit between the contact plug and the semiconductor substrate is avoided.

According to the semiconductor devices and the method of manufacturing the semiconductor device of the above-described respective embodiments of the present disclosure, higher integration is allowed while ensuring flexibility in design. It is to be noted that effects of embodiments of the present disclosure are not limited to this effect, and may include any of effects that will be described below.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present technology, and are incorporated in and constitute a part of this specification. The drawings illustrate embodiments and, together with the specification, serve to describe the principles of the technology.

DETAILED DESCRIPTION

Some embodiments of the present disclosure will be described below in detail with reference to the drawings. It is to be noted that the description will be provided in the following order.

1. First embodiment (a semiconductor device having a transistor of a bulk structure)
2. Modification 1 (a modification in a plane arrangement)
3. Modification 2 (an example in which a low-resistance section is disposed between a contact plug and a memory element)
4. Second embodiment (a semiconductor device having a structure in which a contact plug partially overlaps a gate electrode)
5. Modification 3 (a semiconductor device in which a contact plug is integral with a connection layer connected to a diffusion layer)
6. Third embodiment (a semiconductor device having a SOI structure)
7. Modification 4 (a semiconductor device which has a SOI structure and from which a semiconductor layer on a back surface is removed)

8. Fourth embodiment (a semiconductor device having a structure in which a contact plug covered by an insulating film is connected to a diffusion layer by passing through an element region)
9. Fifth embodiment (a semiconductor device having a structure in which a contact plug covered by an insulating film passes through a separation region)
10. Sixth embodiment (a semiconductor device including a fin-shaped semiconductor layer, and having a bulk structure)
11. Modification 5 (a semiconductor device including a fin-shaped semiconductor layer, and having a SOI structure)
12. Seventh embodiment (a semiconductor device which includes a fin-shaped semiconductor layer and has a SOI structure, and from which a semiconductor layer on a back surface is removed)
13. Eighth embodiment (a semiconductor device having a nano-wire transistor)

First Embodiment

[Structure of Semiconductor Device 1]

Figure 1A:
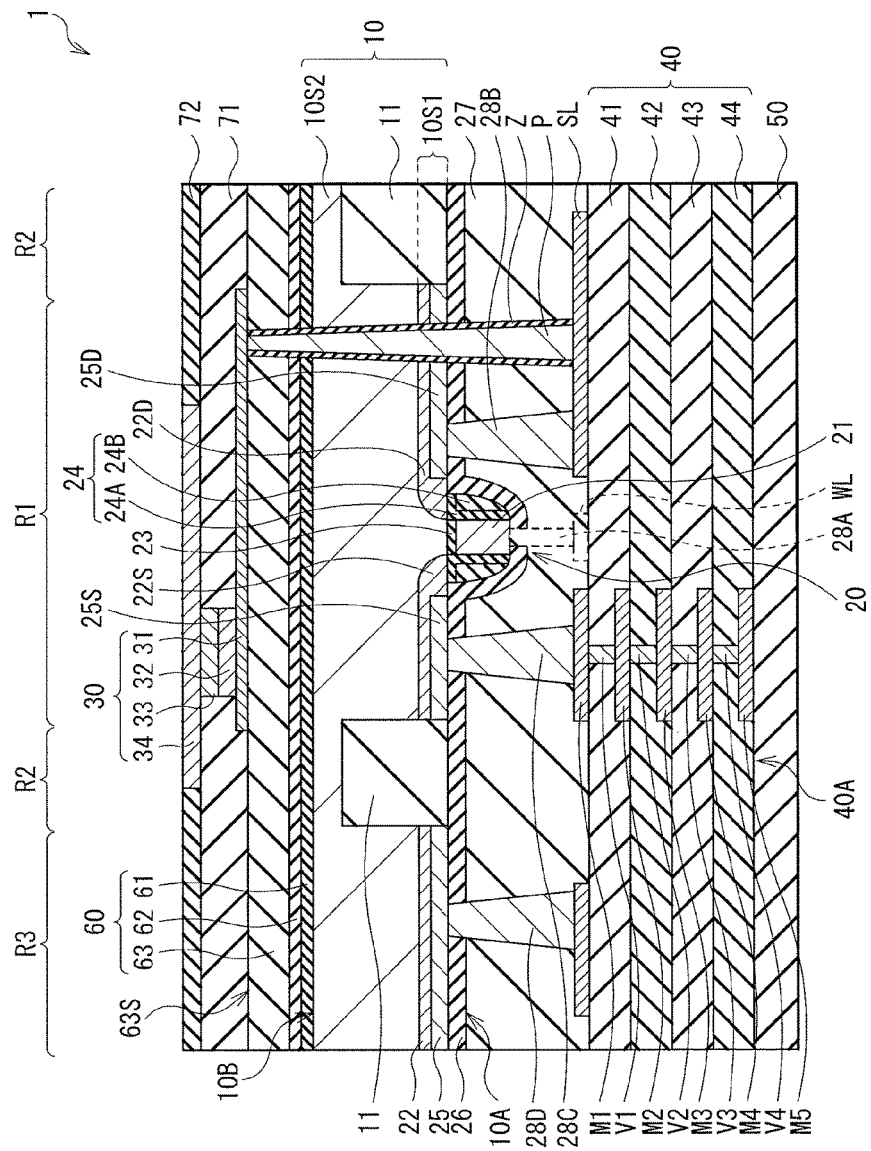
FIG. 1A is a cross-sectional diagram illustrating a semiconductor device according to a first embodiment of the present disclosure.
Figure 1B:
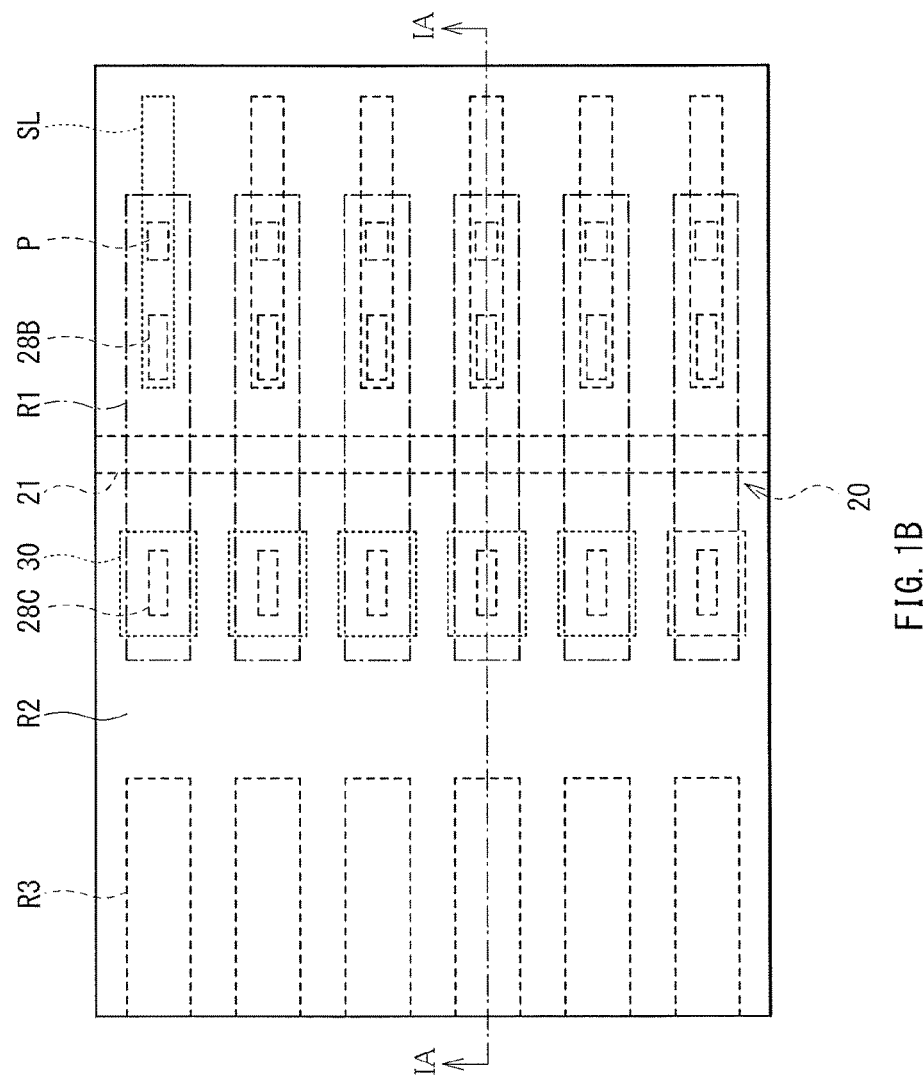
FIG. 1B is a plan view illustrating the semiconductor device illustrated in FIG. 1A.

FIG. 1A illustrates a cross-sectional structure of a semiconductor device 1 according to a first embodiment of the present disclosure. Further, FIG. 1B illustrates a plane structure of the semiconductor device 1. FIG. 1A corresponds to a cross-sectional diagram taken along a cutting-plane line IA-IA and viewed in an arrow direction illustrated in FIG. 1B.

The semiconductor device 1 may include, for example, a multilayered wiring formation section 40, interlayer insulating layers 26 and 27, as well as a semiconductor substrate 10 that are laminated in this order on a supporting substrate 50. A transistor 20 is provided in proximity to a main surface (a surface) 10A of the semiconductor substrate 10. A memory element 30 is provided on a back surface 10B of the semiconductor substrate 10 with an insulating layer 60 interposed therebetween. It is to be noted that FIG. 1B illustrates, by way of example, a case in which six transistors 20 are provided. However, the number of the transistors 20 provided in the semiconductor substrate 10 is not limited in particular. This number may be one, or may be two or more.

The semiconductor substrate 10 has an element region R1 provided with the transistor 20, and a separation region R2 surrounding the element region R1. Further, the semiconductor substrate 10 has a tap region R3 where feeding for setting of an electric potential thereof is performed. The separation region R2 of the semiconductor substrate 10 may be provided with an element separating layer 11 formed by, for example, shallow trench isolation (STI). The element separating layer 11 may be, for example, an insulating film made of a silicon oxide film ($SiO_2$), and have one surface exposed on the main surface 10A of the semiconductor substrate 10.

The semiconductor substrate 10 has a laminated structure including a first semiconductor layer 10S1 (hereinafter referred to as "semiconductor layer 10S1") and a second semiconductor layer 10S2 (hereinafter referred to as "semiconductor layer 10S2"). The semiconductor layer 10S1 occupies only the element region R1. In the semiconductor layer 10S1, for example, a channel region and a pair of diffusion layers 22 (to be described later) forming a part of the transistor 20 may be formed in single crystal silicon. On the other hand, the semiconductor layer 10S2 has a polarity different from that of the semiconductor layer 10S1 in the element region R1, and is formed over the element region R1 and the separation region R2, to cover both of the semiconductor layer 10S1 and the element separating layer 11. The semiconductor layer 10S2 may be made of, for example, single crystal silicon. It is to be noted that, in the tap region R3 as well, the semiconductor substrate 10 has a laminated structure including the semiconductor layers 10S1 and 10S2. However, in the tap region R3, the semiconductor layer 10S2 has the same polarity as that of the diffusion layer 22 of the semiconductor layer 10S1.

A surface of the semiconductor layer 10S2, namely, the back surface 10B of the semiconductor substrate 10, is covered by the insulating layer 60. In the insulating layer 60, the insulating films 61 to 63 are laminated in this order on the back surface 10B.

Further, in the element region R1, a contact plug P extended to pass through the semiconductor substrate 10 is provided. The contact plug P may be made of, for example, a material based on low-resistance metal such as copper (Cu), tungsten (W), and aluminum (Al). In addition, a barrier metal layer may be provided around the low-resistance metal. The barrier metal layer may be made of a simple substance of titanium (Ti) or tantalum (Ta) or an alloy thereof. A periphery of the contact plug P is covered by an insulating film Z, and the contact plug P is electrically separated from the semiconductor substrate 10 (the semiconductor layers 10S1 and 10S2). However, the semiconductor layers 10S are connected to each other in the element region R1, the separation region R2, and the tap region R3.

The transistor 20 is a select transistor of the memory element 30. The transistor 20 may be, for example, a planar-type transistor having a gate electrode 21 and the pair of diffusion layers 22 (22S and 22D) becoming a source region and a drain region. The gate electrode 21 also serves a word line WL of the memory element 30.

The gate electrode 21 is provided on the main surface 10A of the semiconductor substrate 10. However, a gate insulating film 23 made of a silicon oxide film is provided between the gate electrode 21 and the semiconductor substrate 10. On a side face of the gate electrode 21, for example, a side wall 24 made of a laminated film including a silicon oxide film 24A and a silicon nitride film 24B may be provided. To the gate electrode 21, the word line WL is connected.

The pair of diffusion layers 22 may be, for example, layers in which an impurity is diffused in silicon, and may be included in the semiconductor layer 10S1. Specifically, the pair of diffusion layers 22 are the diffusion layer 22S corresponding to the source region and the diffusion layer 22D corresponding to the drain region. The channel region facing the gate electrode 21 in the semiconductor layer 10S1 is provided between the diffusion layers 22S and 22D. A part of the diffusion layer 22 (22S and 22D) is provided with a silicide region 25 (25S and 25D) made of metal silicide such as nickel silicide (NiSi) and cobalt silicide (CoSi). The silicide region 25 reduces contact resistance between connection layers 28A to 28D to be described later and the diffusion layer 22. The silicide region 25 has one surface exposed on the main surface 10A of the semiconductor substrate 10, and a surface opposite to the one surface is covered by the semiconductor layer 10S2. Further, thicknesses of the diffusion layer 22 and the silicide region 25 are both smaller than a thickness of the element separating layer 11. Here, the contact plug P is provided to pass through the silicide region 25D.

The word line WL, a select line SL, and a metal layer M1 are embedded in the interlayer insulating layer 27. Further, the connection layers 28A to 28D are provided to pass through the interlayer insulating layers 26 and 27. Here, the gate electrode 21 is connected to the word line WL through the connection layer 28A. The silicide region 25D of the diffusion layer 22D becoming the drain region is connected to the select line SL through the connection layer 28B. The metal layer M1 of a wiring 40A to be described later is connected to the silicide region 25S of the diffusion layer 22S becoming the source region, through the connection layer 28C. Furthermore, in the tap region R3, the silicide region 25 exposed on the main surface 10A of the semiconductor substrate 10 is connected to other metal layer M1 through the connection layer 28D. In addition, the contact plug P passes through the interlayer insulating layers 26 and 27, and a lower end of the contact plug P is in contact with the select line SL. Therefore, the contact plug P extends to pass through all of the insulating layer 60, the semiconductor substrate 10, the interlayer insulating layer 26, and the interlayer insulating layer 27. For example, the contact plug P may have a truncated pyramid shape or a truncated cone shape. Here, an occupation area of the contact plug P becomes smaller from the main surface 10A to the back surface 10B (i.e., from an upper end to the lower end).

In the multilayered wiring formation section 40, for example, interlayer insulating films 41, 42, 43, and 44 may be laminated in this order from the one closest to the transistor 20, and may be provided with the wiring 40A. The wiring 40A has a structure in which metal layers M1, M2, M3, M4, and M5 are laminated. Here, the metal layers M1, M2, M3, M4, and M5 are embedded in the interlayer insulating films 27, 41, 42, 43, and 44, respectively. Further, the metal layers M1 and M2 are connected by a via V1 passing through the interlayer insulating film 41. Similarly, the metal layers M2 and M3 are connected by a via V2 passing through the interlayer insulating film 42. The metal layers M3 and M4 are connected by a via V3 passing through the interlayer insulating film 43. The metal layers M4 and M5 are connected by a via V4 passing through the interlayer insulating film 44. As described above, the wiring 40A is connected to the diffusion layer 22 serving as the source region, through the connection layer 28C in contact with the metal layer M1. It is to be noted that the multilayered wiring formation section 40 has the structure illustrated in FIG. 1A as an example, and is not limited thereto.

The multilayered wiring formation section 40 is bonded to the supporting substrate 50. The supporting substrate 50 may be, for example, a substrate made of single crystal silicon. It is to be noted that the material of the supporting substrate 50 is not limited in particular, and may be a material such as $SiO_2$ and glass, other than the single crystal silicon.

As described above, the insulating layer 60 has the laminated structure in which the insulating films 61, 62, and 63 are laminated in this order, to cover the semiconductor substrate 10. The insulating film 61 may be configured of, for example, a High-K (high dielectric) film, namely, Hf oxide; $Al_2O_3$; Ru oxide; Ta oxide; oxide containing Al, Ru, Ta, or Hf and Si; nitride containing Al, Ru, Ta, or Hf and Si; or oxynitride containing Al, Ru, Ta, or Hf and Si, capable of being formed at a low temperature. The insulating films 62 and 63 may be configured of, for example, $SiO_2$. Alternatively, the insulating film 63 may be desirably made of a material (Low-K) having a dielectric constant lower than that of $SiO_2$. On a surface 63S (i.e., a surface opposite to the semiconductor substrate 10) of the insulating film 63, a conductive layer 31 is provided. The conductive layer 31 is in contact with the upper end of the contact plug P.

In the memory element 30, for example, the conductive layer 31, a memory section 32, a conductive layer 33, and a conductive layer 34 may be laminated in this order. The conductive layer 31 serves as a lower electrode, and the conductive layer 33 serves as an upper electrode (serving also as a bit line BL). The conductive layer 31 is connected to the silicide region 25, through the contact plug P, the select line SL, and the connection layer 28B.

Around the memory section 32 as well as the conductive layers 31 and 33, a back-surface interlayer film 71 is provided. A material of the back-surface interlayer film 71 may be, for example, $SiO_2$, a Low-K (low dielectric) film, or the like. A part around the conductive layer 34 is filled with an insulating layer 72.

The memory section 32 in the memory element 30 may be preferably, for example, a spin transfer torque-magnetic tunnel junction (STT-MTJ) element that stores therein information by reversing a direction of magnetization of a memory layer to be described later, by spin injection. The STT-MTJ allows high-speed writing and reading, and therefore is regarded as nonvolatile memory expected to replace volatile memory.

The conductive layers 31 and 33 may each be configured of, for example, a metal layer made of metal such as Cu, Ti, W, and Ru. The conductive layers 31 and 33 may be preferably configured of mainly Cu, Al, or W, which is metal other than a material of a primary layer 32A or a cap layer 32E to be described later. Further, the conductive layers 31 and 33 may also be configured of any of Ti, TiN, Ta, TaN, W, Cu, and Al, as well as a laminated structure of these elements.

Figure 2:
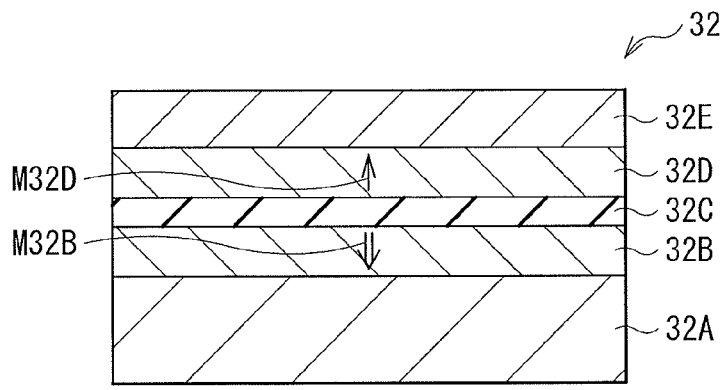
FIG. 2 is a cross-sectional diagram illustrating an example of a structure of a memory section of a memory element illustrated in FIG. 1.

FIG. 2 illustrates an example of a structure of the memory section 32. The memory section 32 may have, for example, a structure in which the primary layer 32A, a magnetization fixed layer 32B, an insulating layer 32C, a memory layer 32D, and the cap layer 32E are laminated in this order from a side close to the conductive layer 31. In other words, the memory element 30 has a bottom-pinned structure in which the magnetization fixed layer 32B, the insulating layer 32C, and the memory layer 32D are provided in this order from a bottom to a top in a lamination direction. Information is stored by changing a direction of magnetization M32D of the memory layer 32D having uniaxial anisotropy. By a relative angle (parallel or antiparallel) between the magnetization M32D of the memory layer 32D and magnetization M32B of the magnetization fixed layer 32B, "0" or "1" of the information is defined.

The primary layer 32A and the cap layer 32E are configured of a metal film made of metal such as Ta and Ru, or a laminated film of these elements.

The magnetization fixed layer 32B is a reference layer that is a base of memory information (a magnetization direction) of the memory layer 32D. The magnetization fixed layer 32B is configured of a ferromagnetic substance having magnetic moment in which a direction of the magnetization M32B is fixed in a film-surface vertical direction. The magnetization fixed layer 32B may be configured of, for example, Co—Fe—B.

A change in the direction of the magnetization M32B of the magnetization fixed layer 32B by writing or reading may be undesirable, but may not be necessarily fixed in a specific direction. It may only be necessary to make the direction of the magnetization M32B move less easily than that of the magnetization M32D of the memory layer 32D. For example, the magnetization fixed layer 32B may only be made to have a coercive force, a magnetic film thickness, or a magnetic damping constant larger than that of the memory layer 32D. To fix the direction of the magnetization M32B, for example, an antiferromagnetic substance such as PtMn and IrMn may only be brought into contact with the magnetization fixed layer 32B. Alternatively, the direction of the magnetization M32B may be indirectly fixed by magnetically coupling a magnetic substance in contact with such an antiferromagnetic substance, to the magnetization fixed layer 32B, through a nonmagnetic substance such as Ru.

The insulating layer 32C is an intermediate layer that becomes a tunnel barrier layer (a tunnel insulating layer), and may be configured of, for example, aluminum oxide or magnesium oxide (MgO). Above all, the insulating layer 32C may be preferably configured of the magnesium oxide. This makes it possible to increase a magneto-resistive change rate (a MR ratio). Therefore, it is possible to reduce a current density used to reverse the direction of the magnetization M32D of the memory layer 32D, by improving efficiency of spin injection.

The memory layer 32D is configured of a ferromagnetic substance having magnetic moment in which the direction of the magnetization M32D is freely changed to the film-surface vertical direction. The memory layer 32D may be configured of, for example, Co—Fe—B.

Figure 3:
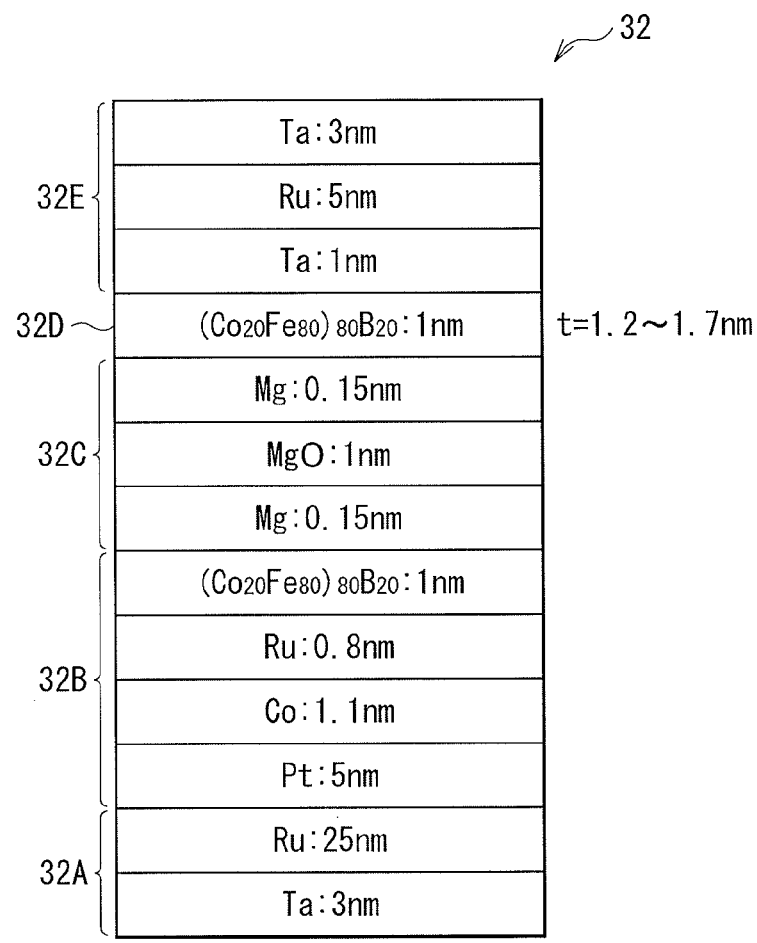
FIG. 3 is a cross-sectional diagram illustrating an example of a structure of each layer of the memory section illustrated in FIG. 2.

FIG. 3 illustrates an example of a structure of each layer of the memory section 32 in more detail. The primary layer 32A may have, for example, a structure in which a Ta layer having a thickness of about 3 nm and a Ru film having a thickness of about 25 nm are laminated in this order from a side close to the first electrode 31. The magnetization fixed layer 32B may have, for example, a structure in which a Pt layer having a thickness of about 5 nm, a Co layer having a thickness of about 1.1 nm, a Ru layer having a thickness of about 0.8 nm, and a $(Co_{20}Fe_{80})_{80}B_{20}$ layer having a thickness of about 1 nm are laminated in this order from a side close to the first electrode 31. The insulating layer 32C may have, for example, a structure in which an Mg layer having a thickness of about 0.15 nm, an MgO layer having a thickness of about 1 nm, and an Mg layer having a thickness of about 0.15 nm are laminated in this order from a side close to the first electrode 31. The memory layer 32D may have, for example, a thickness of about 1.2 nm to about 1.7 nm, and be configured of a $(Co_{20}Fe_{80})_{80}B_{20}$ layer. The cap layer 32E may have, for example, a structure in which a Ta layer having a thickness of about 1 nm, a Ru layer having a thickness of about 5 nm, and a Ta layer having a thickness of about 3 nm are laminated in this order from a side close to the first electrode 31.

[Method of Manufacturing Semiconductor Device 1]

The semiconductor device 1 may be manufactured as follows, for example.

FIGS. 4A to 4J each illustrate a part of a method of manufacturing the semiconductor device 1, in process order. First, the semiconductor substrate 10 made of the above-described material is prepared, and a large scale integrated circuit (LSI) is formed on the main surface 10A side of the semiconductor substrate 10, by a typical manufacturing process. It is to be noted that, in a case of a logic LSI, a multilayered wiring layer of nine or more layers is usually formed. FIGS. 4A to 4J mainly illustrate a logic LSI structure, but an existing element such as an existing dynamic random access memory (DRAM) may be incorporated.

Figure 4A:
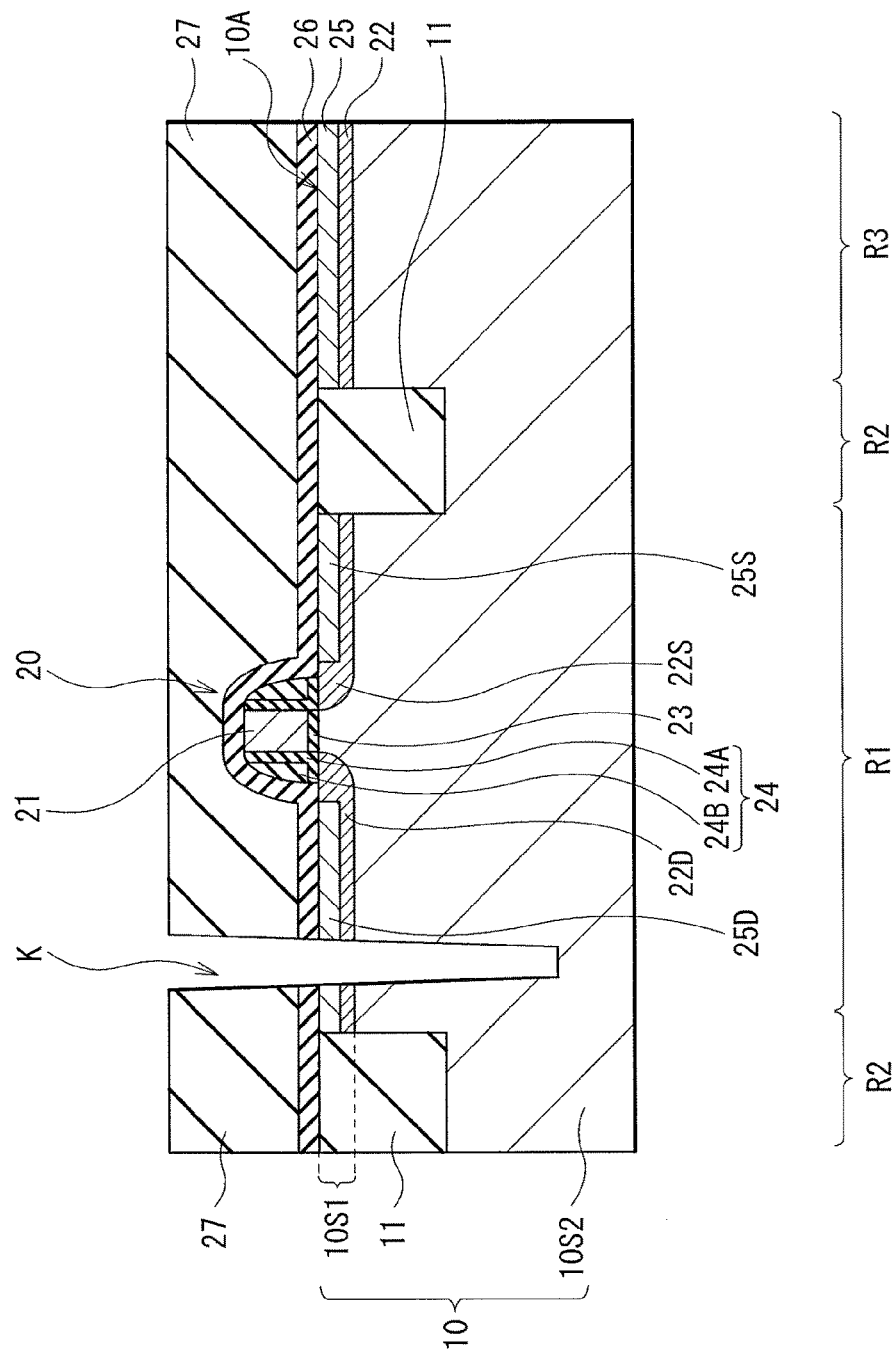
FIG. 4A is a cross-sectional diagram illustrating a process in a method of manufacturing the semiconductor device illustrated in FIG. 1.

To be more specific, as illustrated in FIG. 4A, for example, the element separating layer 11 may be formed by STI on the main surface 10A side of the semiconductor substrate 10. In a region surrounded by the element separating layer 11 in the semiconductor substrate 10, i.e., in the element region R1, the transistor 20 having the gate electrode 21 and the pair of diffusion layers 22 is fabricated. In a part of each of the diffusion layers 22, the silicide region 25 is formed. Next, the interlayer insulating films 26 and 27 are formed to cover the transistor 20. Subsequently, in the element region R1, a through hole K is formed by sequentially hollowing out the interlayer insulating layer 27, the interlayer insulating layer 26, the silicide region 25D (the semiconductor layer 10S1), and the semiconductor layer 10S2. It is to be noted that an opening may be formed beforehand at a position where the through hole K is to be formed, in the silicide region 25D, when the transistor 20 is fabricated. In this case, it is possible to suppress diffusion of the material (for example, Ni, Co, etc.) of the silicide region 25D.

Figure 4B:
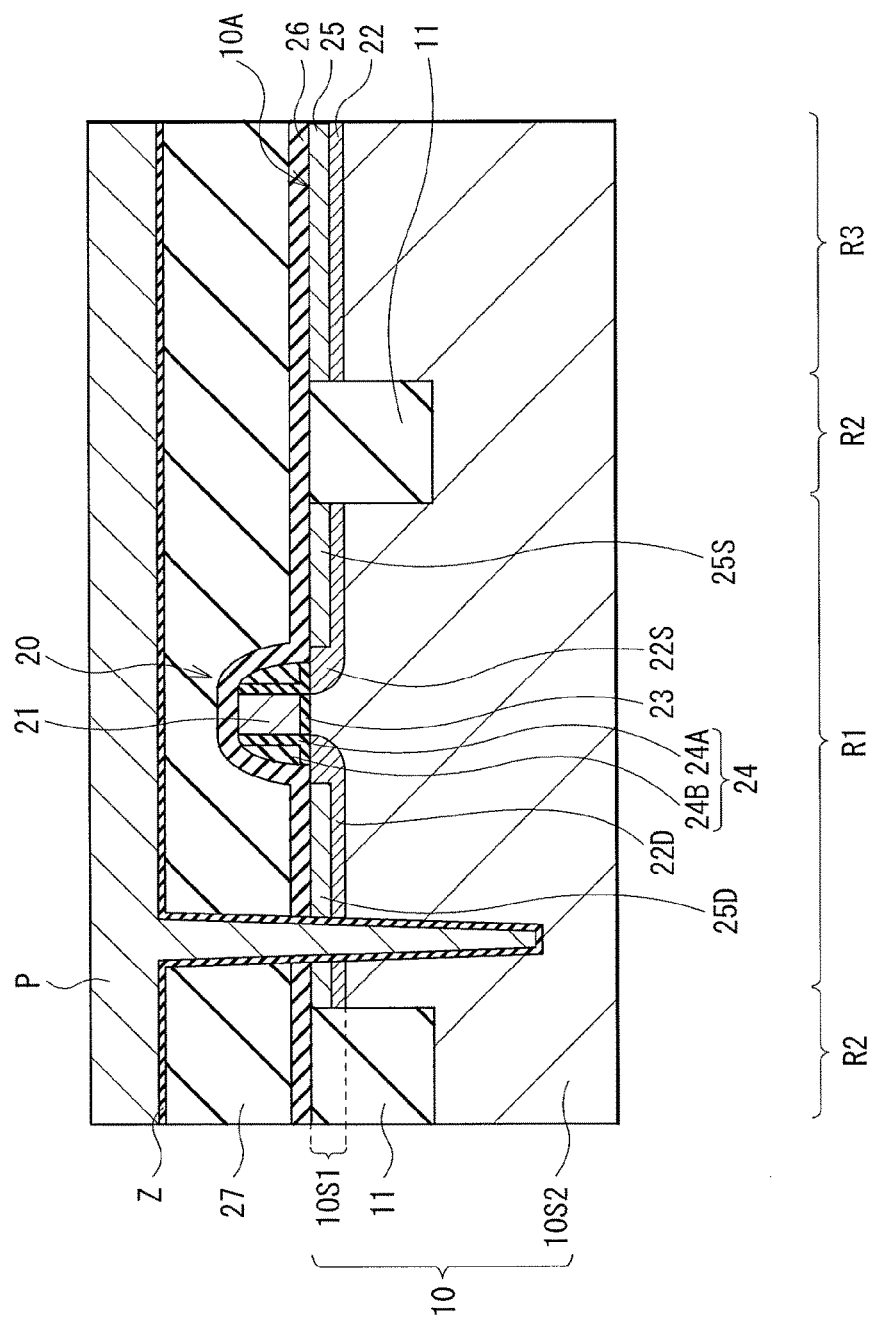
FIG. 4B is a cross-sectional diagram illustrating a process following the process in FIG. 4A.

Next, as illustrated in FIG. 4B, the insulating film Z is formed to cover a wall surface of the through hole K. At this moment, the insulating film Z also covers a top surface of the interlayer insulating layer 27. Subsequently, the contact plug P is formed by filling inside of the through hole K whose wall surface is covered by the insulating film Z, with a metallic material. At this moment, the metallic material is also formed on the insulating film Z covering the top surface of the interlayer insulating layer 27.

Figure 4C:
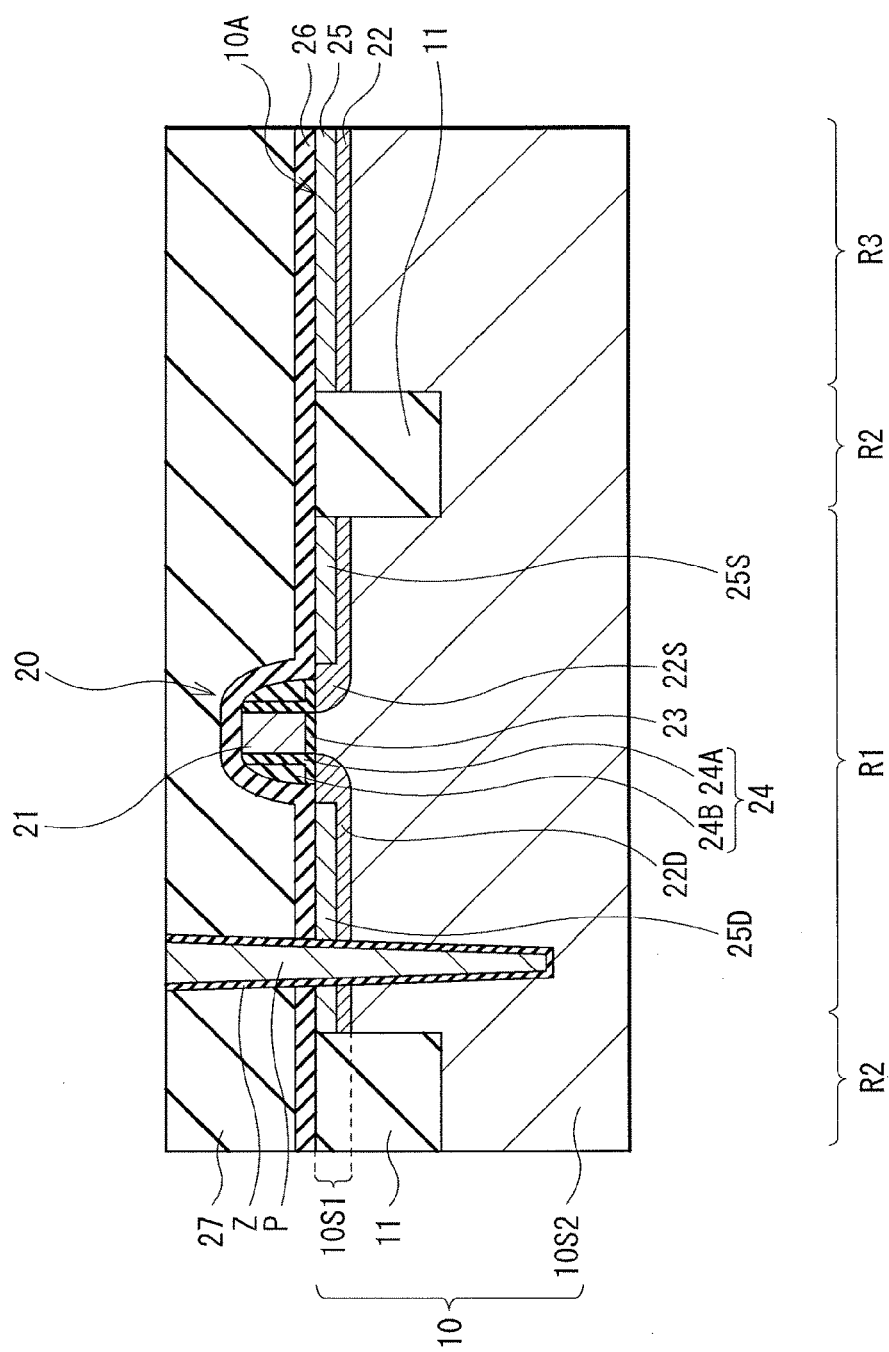
FIG. 4C is a cross-sectional diagram illustrating a process following the process in FIG. 4B.

Next, as illustrated in FIG. 4C, of the insulating film Z and the metallic material, a part covering the top surface of the interlayer insulating layer 27 is removed by chemical mechanical polishing (CMP), etch back, or the like. As a result, of the insulating film Z and the metallic material, only a part filling the through hole K remains, so that the contact plug P whose periphery is covered by the insulating film Z is completed.

Figure 4D:
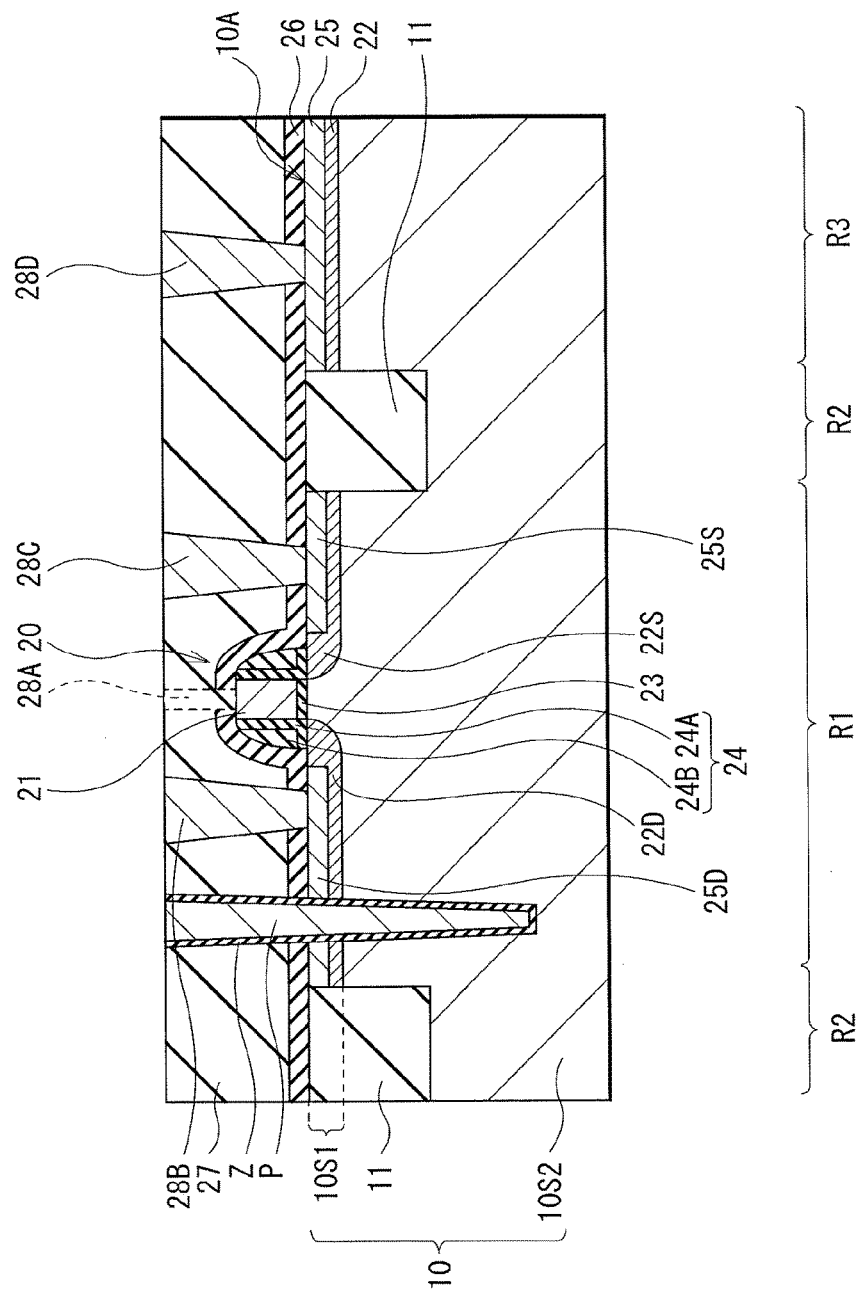
FIG. 4D is a cross-sectional diagram illustrating a process following the process in FIG. 4C.
Figure 4E:
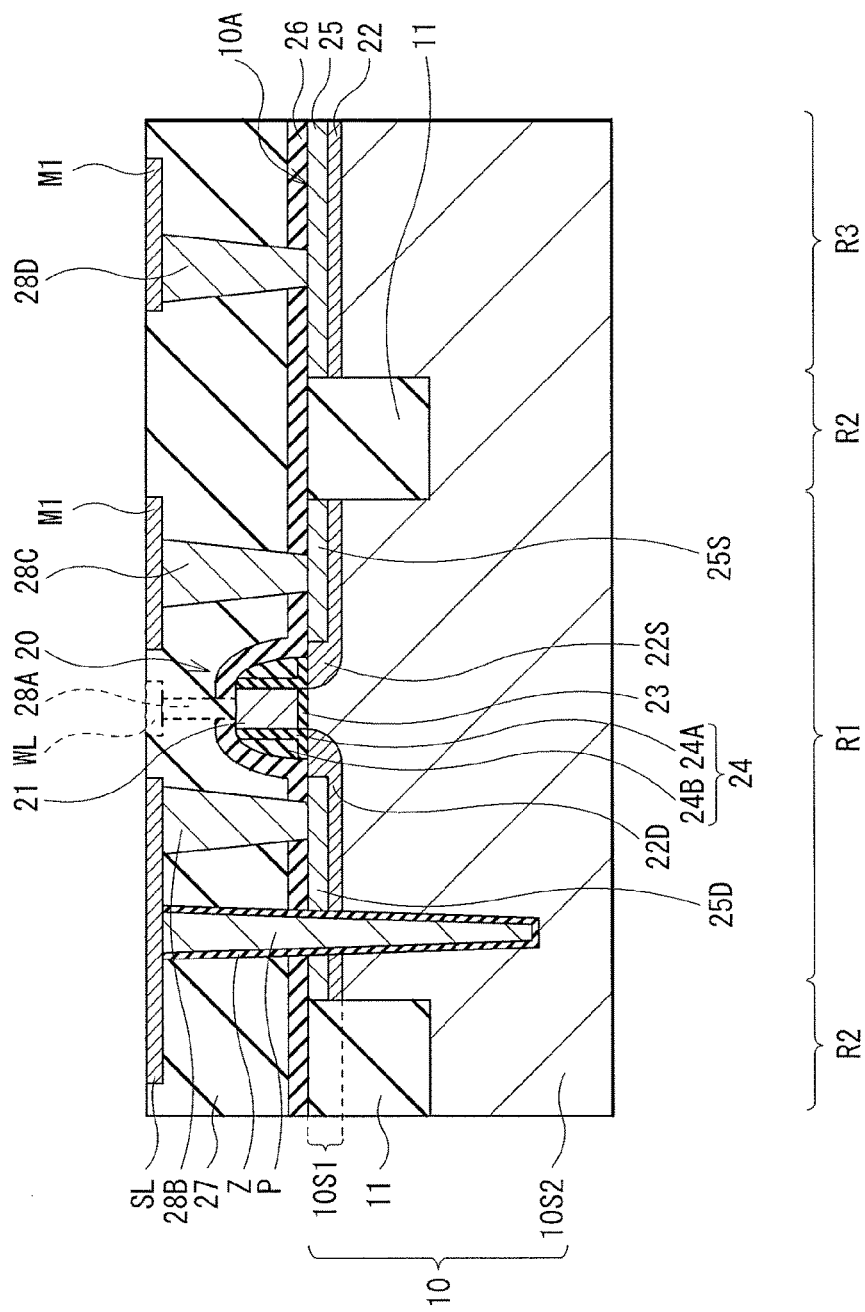
FIG. 4E is a cross-sectional diagram illustrating a process following the process in FIG. 4D.

Next, as illustrated in FIG. 4D, the connection layers 28A to 28D to pass through the interlayer insulating layers 26 and 27 are formed at positions different from the position where the contact plug P is formed. Subsequently, as illustrated in FIG. 4E, the word line WL, the select line SL, and the metal layer M1 are formed collectively. In this process, the word line WL is formed to be in contact with an upper end of the connection layer 28A connected to the gate electrode 21. The select line SL is formed to cover both one end of the contact plug P and one end of the connection layer 28B. Further, the metal layer M1 is formed to cover one end of the connection layer 28C, and the other metal layer M1 is formed to cover one end of the connection layer 28D.

Figure 4F:
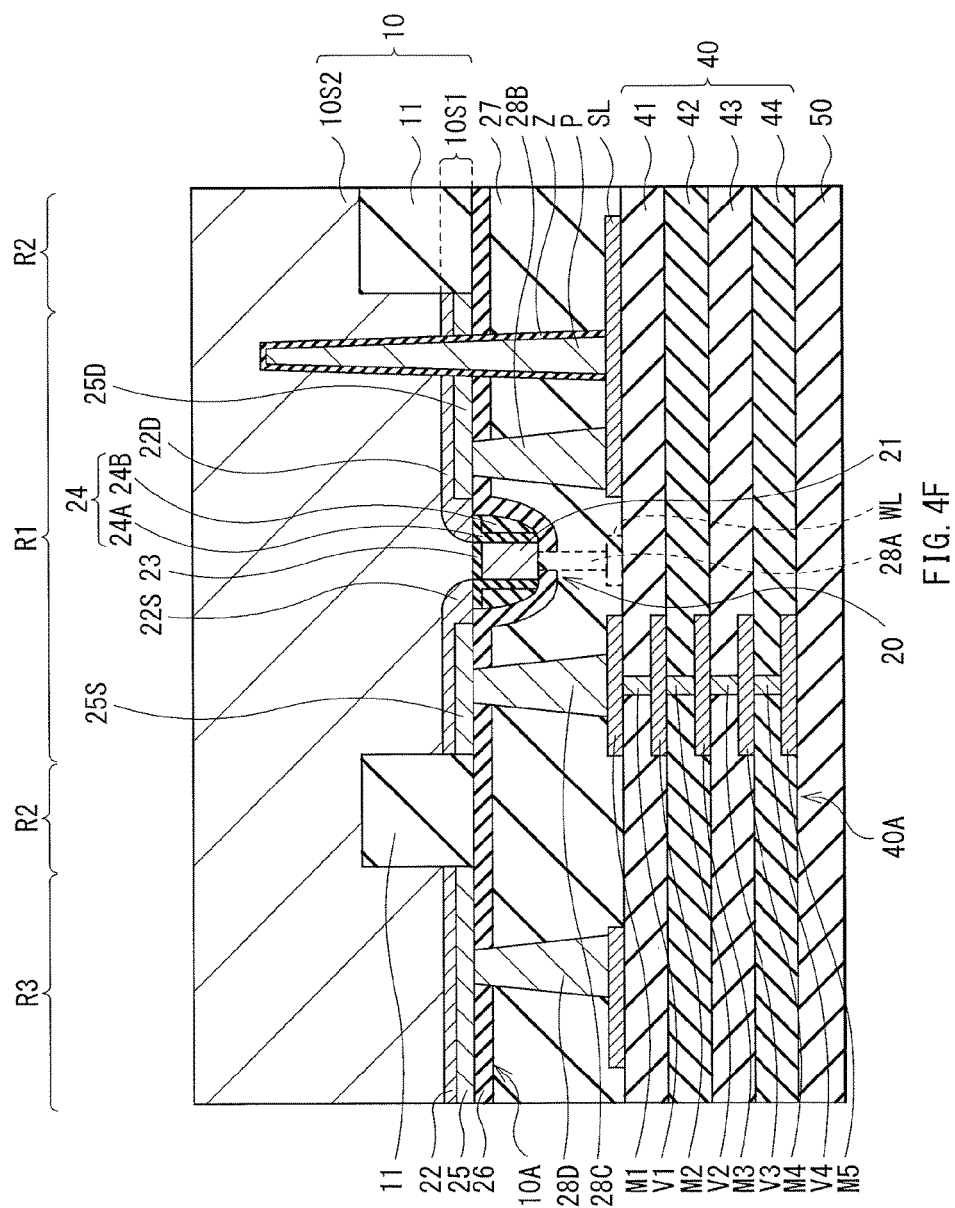
FIG. 4F is a cross-sectional diagram illustrating a process following the process in FIG. 4E.

Next, the multilayered wiring formation section 40 is formed on the interlayer insulating layer 27. Subsequently, as illustrated in FIG. 4F, the laminated structure fabricated so far is turned upside down, and then the supporting substrate 50 is adhered to a surface, which is opposite to the semiconductor substrate 10, of the multilayered wiring formation section 40, at a low temperature using a technique such as plasma.

Figure 4G:
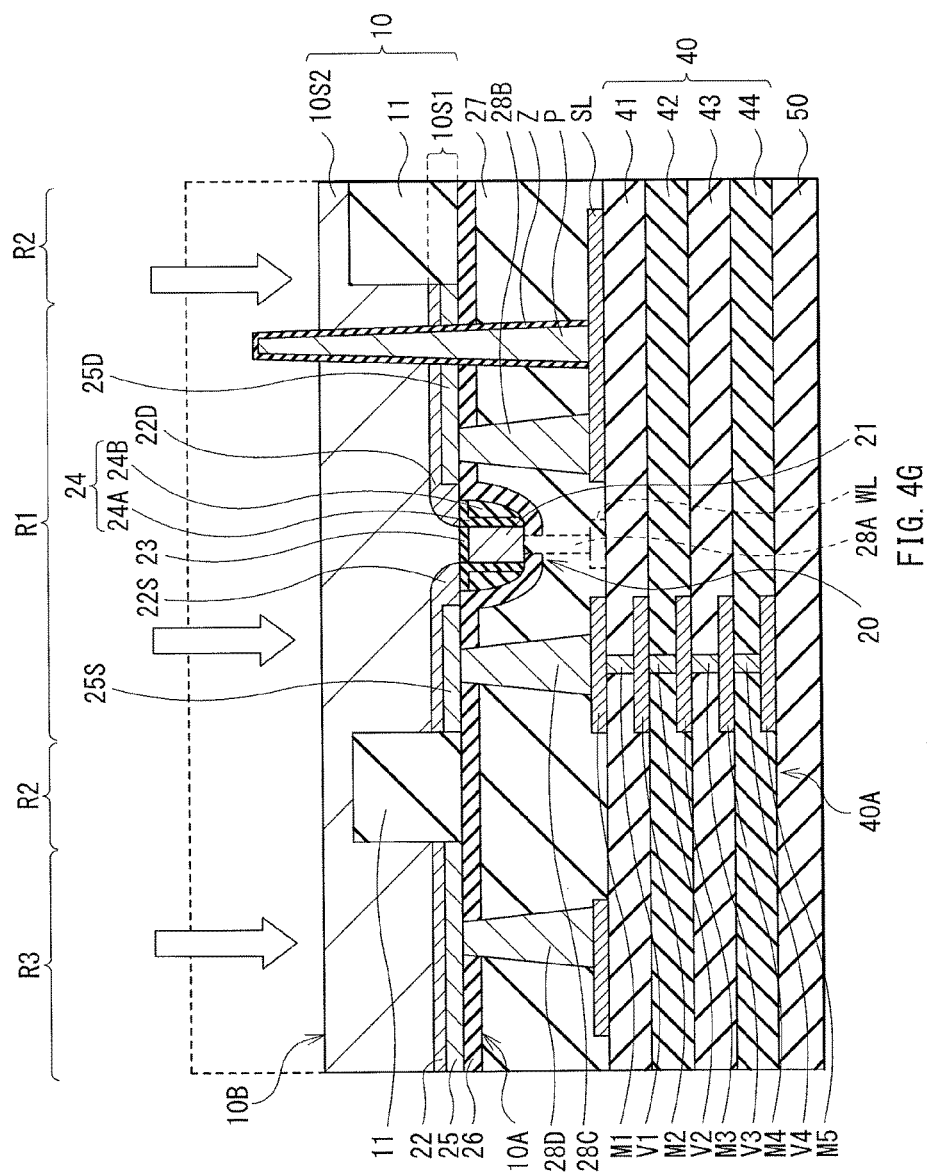
FIG. 4G is a cross-sectional diagram illustrating a process following the process in FIG. 4F.

Next, the semiconductor layer 10S2 in the semiconductor substrate 10 may be polished by, for example, CMP, and this polishing is stopped once, before arriving at the contact plug P and the insulating film Z covering the contact plug P. Subsequently, the semiconductor layer 10S2 may be selectively removed by, for example, etch back. For example, when the semiconductor layer 10S2 is made of Si, a SF-based gas alone may be used as an etching gas. The etch back is stopped before arriving at the element separating layer 11. Here, of the semiconductor layer 10S2, a part remaining on the element separating layer 11 may have, for example, a thickness of about 0.1 µm or more and about 1 µm or less. The back surface 10B is thus formed, as illustrated in FIG. 4G. However, at this stage, a tip of the contact plug P covered by the insulating film Z protrudes from the back surface 10B.

Figure 4H:
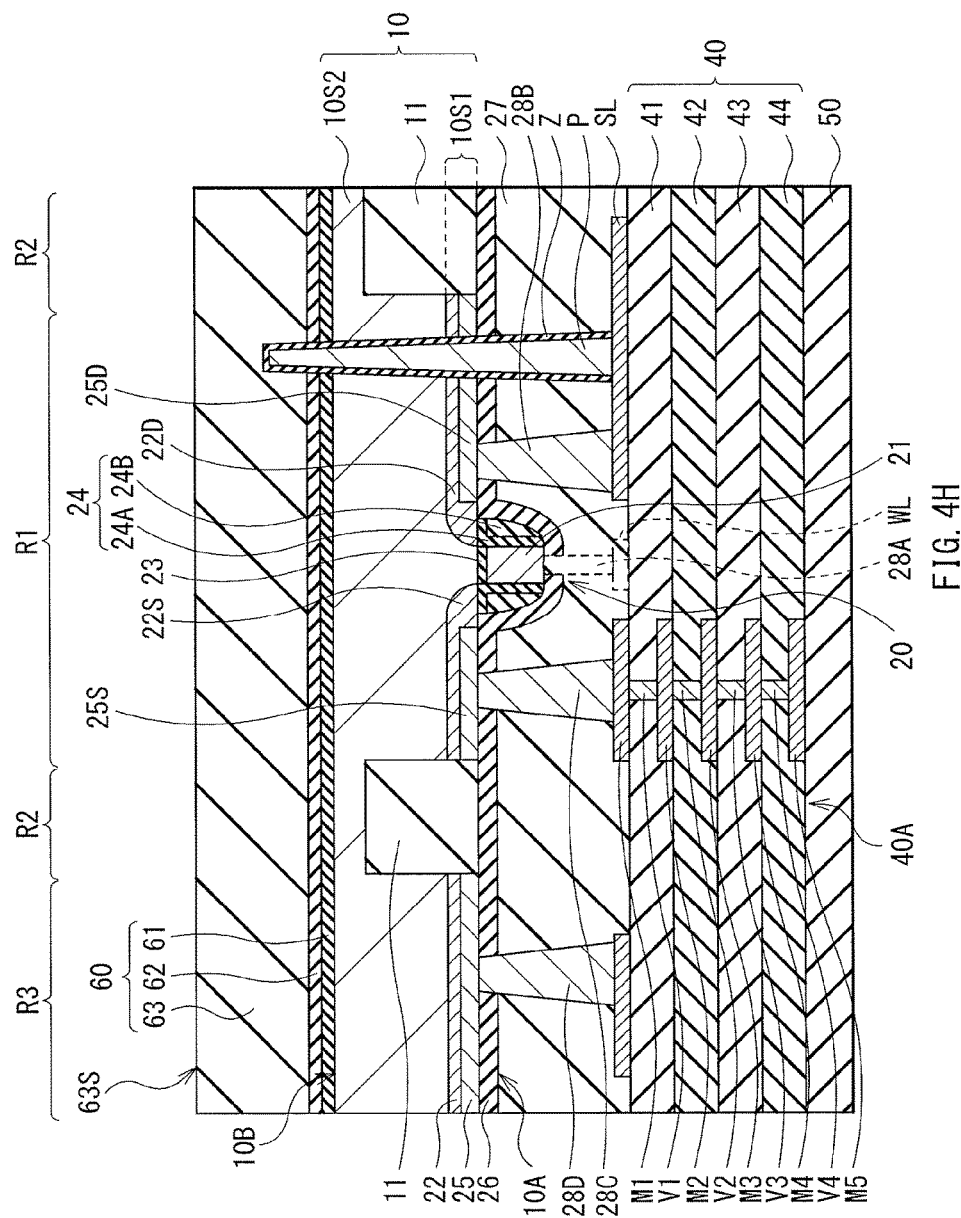
FIG. 4H is a cross-sectional diagram illustrating a process following the process in FIG. 4G.

Subsequently, as illustrated in FIG. 4H, the insulating films 61 to 63 made of the above-described predetermined materials may be formed in this order, to cover the back surface 10B of the semiconductor substrate 10, by using chemical vapor deposition (CVD), for example. In this process, of the insulating film 63, the surface 63S that is an uppermost layer is made to be higher than the tip of the contact plug P covered by the insulating film Z.

Figure 4J:
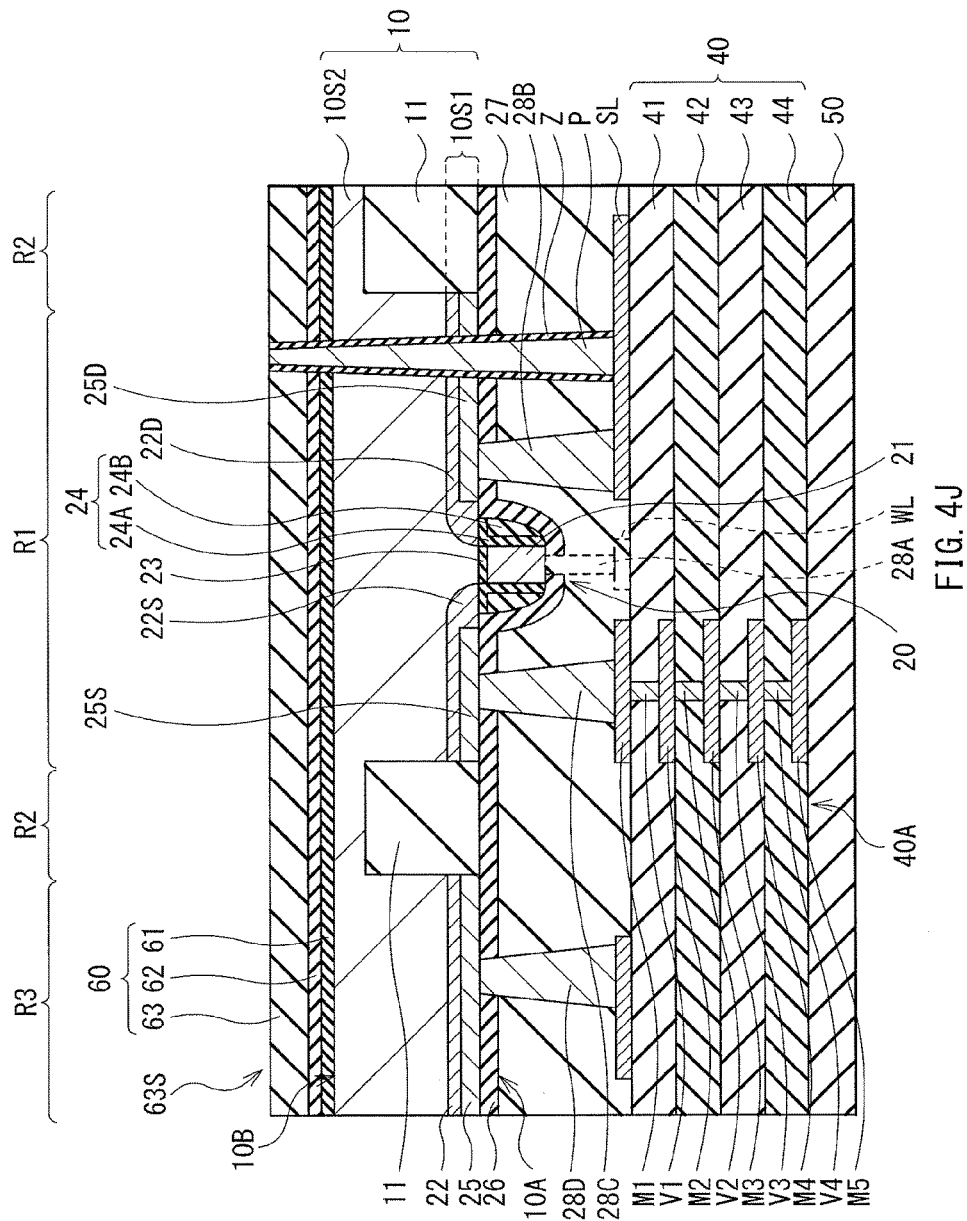
FIG. 4J is a cross-sectional diagram illustrating a process following the process in FIG. 4H.

Next, as illustrated in FIG. 4J, the tip of the contact plug P is exposed by removing, together with the insulating film 63, the insulating film Z covering the tip of the contact plug P, by CMP or etch back. Subsequently, the conductive layer 31 is formed to cover the tip of the contact plug P. Afterwards, the memory section 32 and the conductive layer 33 are formed on the conductive layer 31 and then, the back-surface interlayer film 71 is formed to cover the whole. Finally, the conductive layer 34 is formed to be in contact with a top surface of the conductive layer 33, and the part around the conductive layer 34 is filled with the insulating layer 72, so that the memory element 30 is formed.

The semiconductor device 1 is thus completed.

[Operation of Semiconductor Device 1]

In the semiconductor device 1, a current is applied in the film-surface vertical direction of the memory section 32, corresponding to HIGH or LOW of an electric potential between the select line SL and the conductive layer 33 serving as the bit line BL, thereby causing spin torque magnetization reversal. As a result, the direction of the magnetization M32D of the memory layer 32D is made parallel or antiparallel with the direction of the magnetization M32B of the magnetization fixed layer 32B, thereby changing the resistance value of the memory section 32 between a large value and a small value, to perform writing of information.

On the other hand, the information stored in the memory section 32 is allowed to be read out by providing the memory layer 32D with a magnetic layer (not illustrated) to be a base of the information, with a thin insulating film interposed therebetween, and using a ferromagnetic tunneling current flowing through the insulating layer 32C. The reading may also be performed using a magnetoresistance effect.

[Functions and Effects of Semiconductor Device 1]

In the semiconductor device 1 and the method of manufacturing the semiconductor device 1, the periphery of the contact plug P passing through the semiconductor substrate 10 is covered by the insulating film Z. Therefore, the contact plug P is reliably insulated from the semiconductor substrate 10 (the semiconductor layer 10S2). For this reason, an unintentional short circuit between the contact plug P and the semiconductor substrate 10 is avoided. In addition, for example, even if the memory element 30 is provided on a side, which is opposite to the surface on which the transistor 20 is provided, of the semiconductor substrate 10, a short circuit between the contact plug P and an unintended part (for example, the gate electrode 21, etc.) of the transistor 20 is avoided. Therefore, it is possible to dispose the transistors 20 more in a smaller region, while ensuring flexibility in design, so that higher integration is achievable.

In addition, the semiconductor layer 10S2 is provided over the element region R1, the separation region R2, and the tap region R3, as a layer common to these regions. Therefore, it is possible to arbitrarily set an electric potential in the element region R1, of the semiconductor substrate 10, by feeding power to the semiconductor layer 10S2 of the tap region R3 through the connection layer 28D. As a result, it is possible to fix an electric potential of the semiconductor substrate 10 at an arbitrary value, thereby allowing a bulk transistor to be utilized effectively. Moreover, for example, higher operating speed and lower power consumption utilizing a so-called substrate bias effect are achievable. In other words, it is possible to increase the operating speed of the transistor 20 by lowering a threshold voltage Vth by forward-biasing the semiconductor substrate 10 during operation, and to reduce a current leakage by back-biasing the semiconductor substrate 10 on standby.

[Modification 1]

Figure 5:
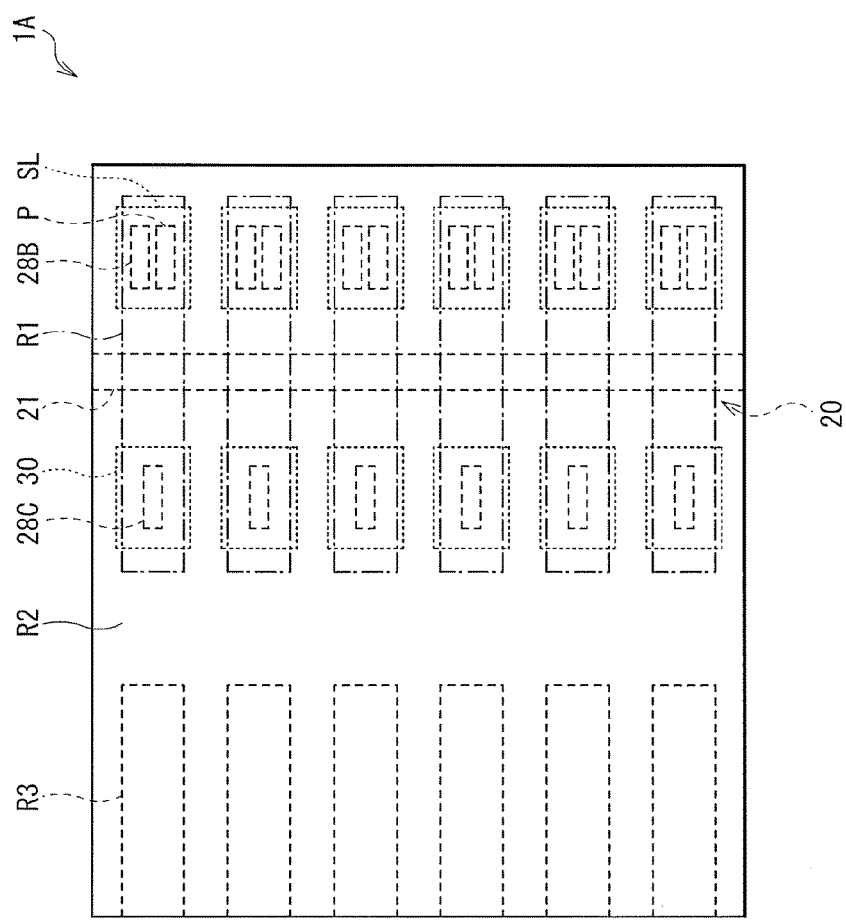
FIG. 5 is a plan view illustrating a first modification of the semiconductor device according to the first embodiment of the present disclosure.

FIG. 5 illustrates a plane structure of a semiconductor device 1A according to a first modification of the above-described semiconductor device 1. In the above-described semiconductor device 1, the contact plug P is disposed on an extension of a direction in which the connection layers 28A, 28B, and 28C are arranged, but the present technology is not limited thereto. As in the semiconductor device 1A illustrated in FIG. 5, the contact plug P may be arranged to be adjacent to the connection layer 28B in an extending direction of the gate electrode 21. Effects similar to those of the semiconductor device 1 are obtained in this case as well. In addition, the semiconductor device 1A has a more compact layout than that of the semiconductor device 1.

[Modification 2]

Figure 6A:
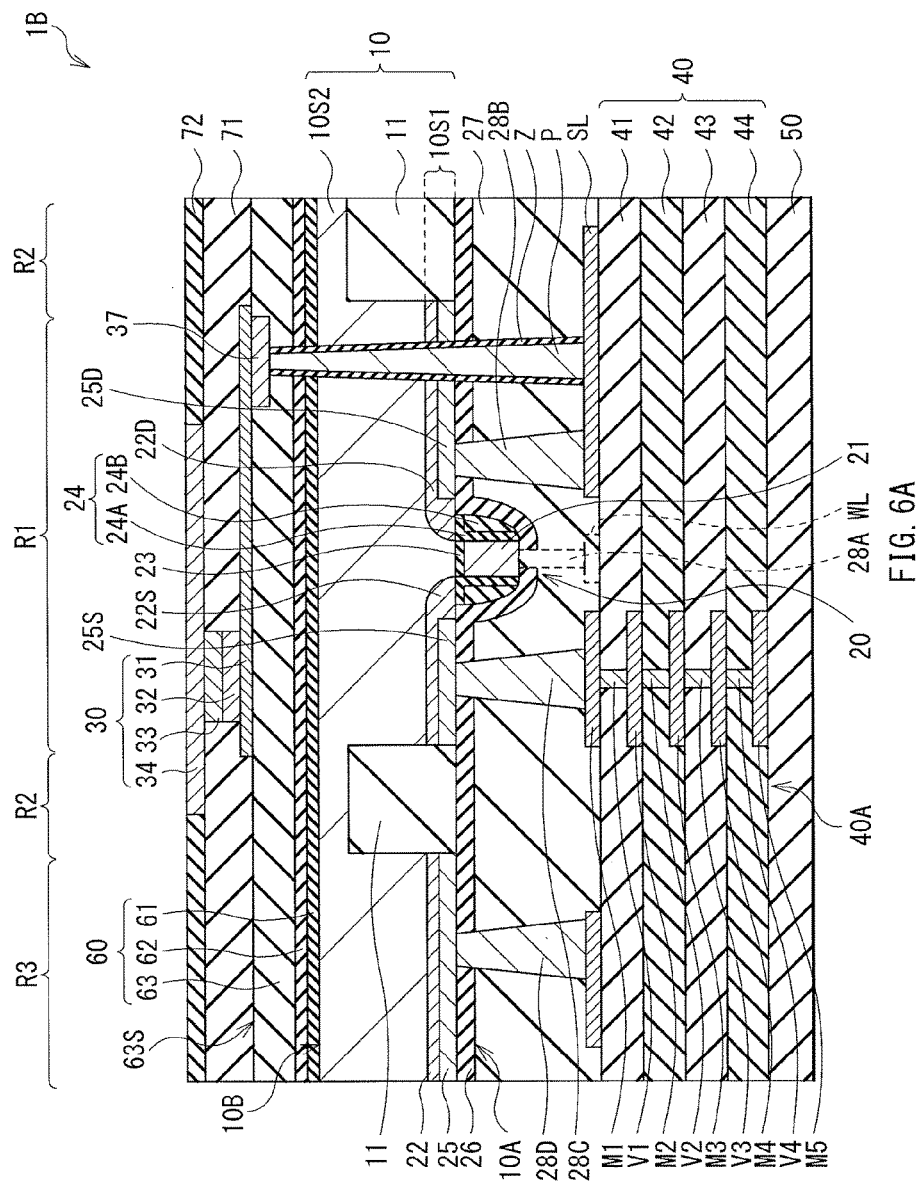
FIG. 6A is a cross-sectional diagram illustrating a second modification of the semiconductor device according to the first embodiment of the present disclosure.
Figure 6B:
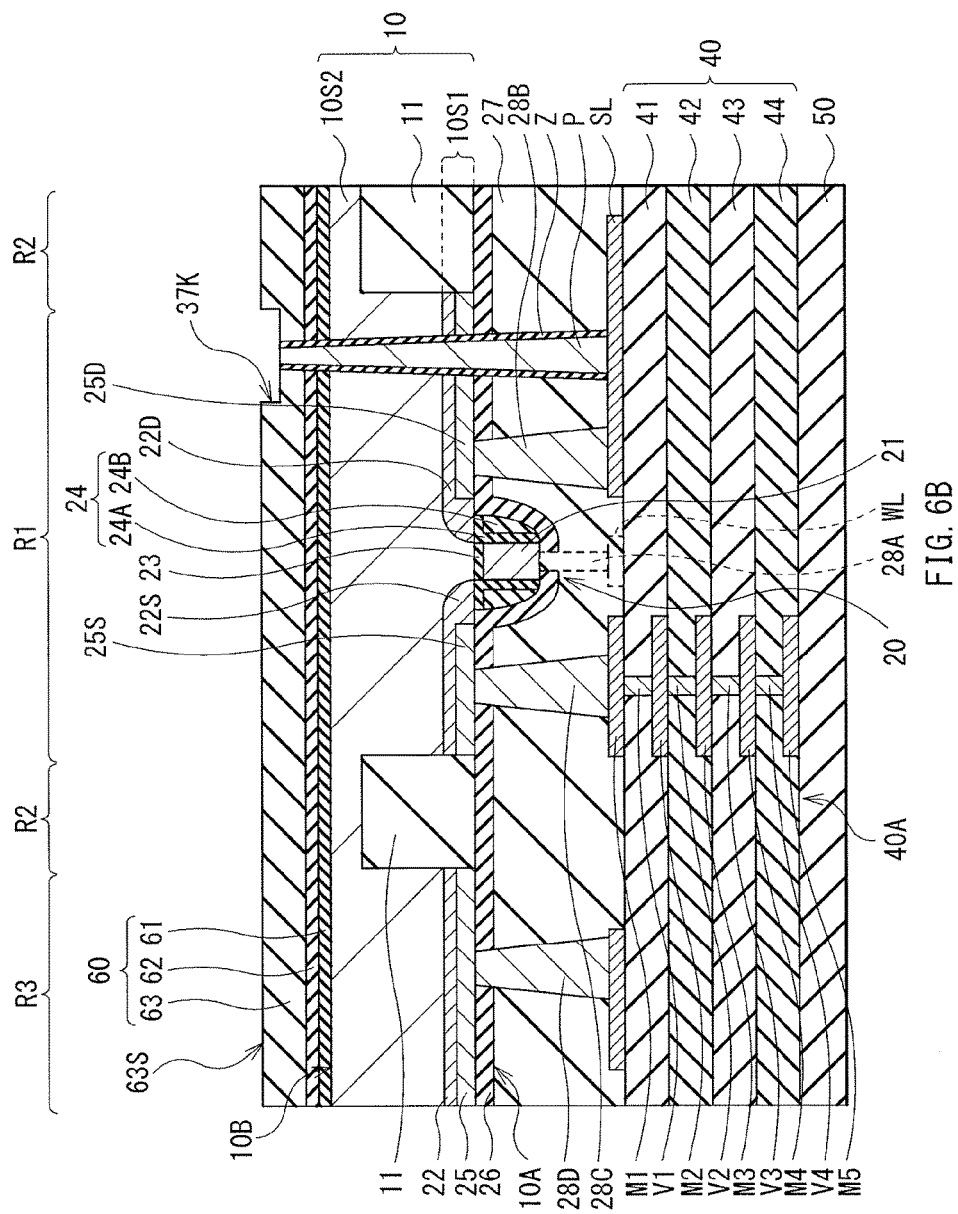
FIG. 6B is a cross-sectional diagram illustrating a process in a method of manufacturing the semiconductor device illustrated in FIG. 6A.
Figure 6C:
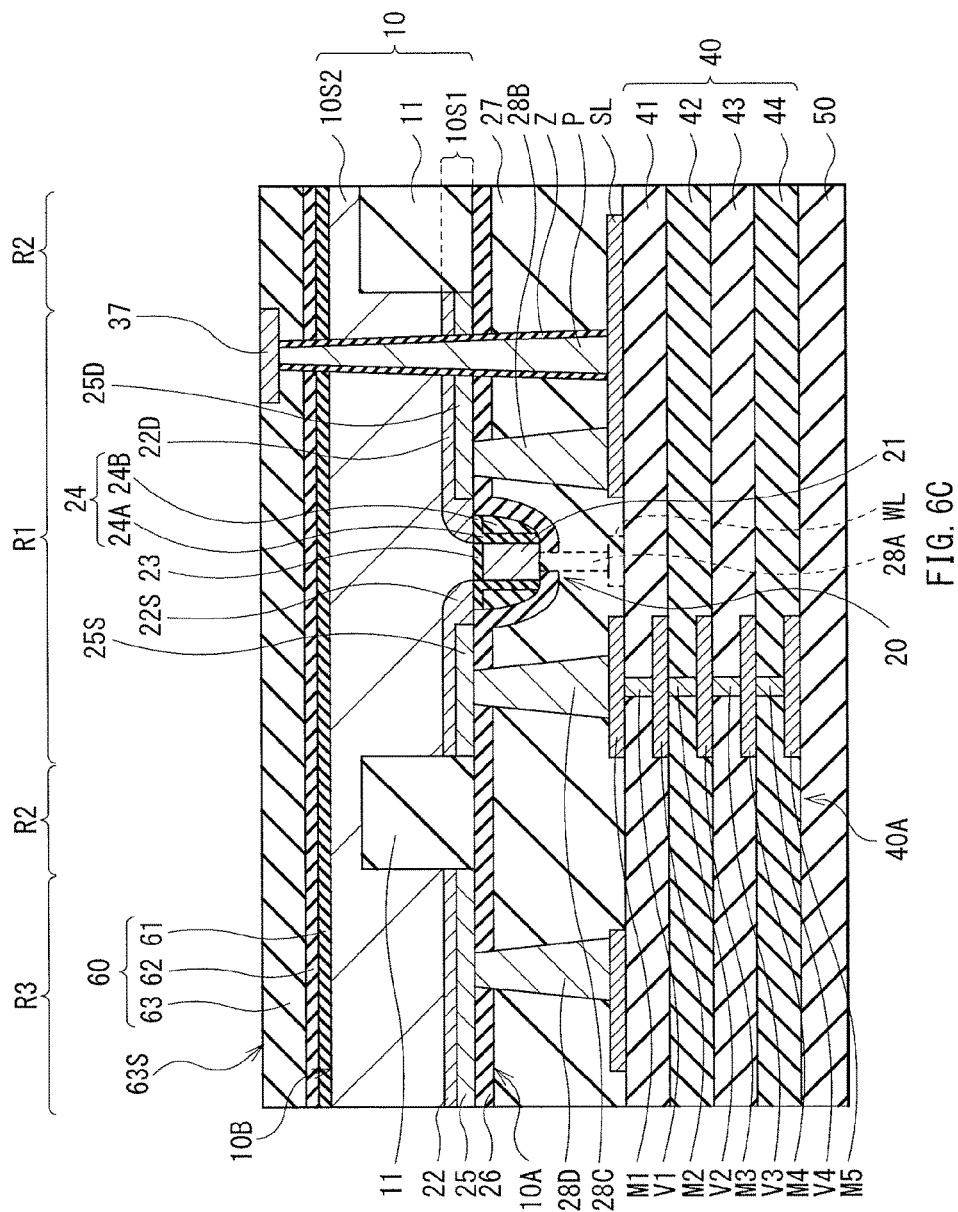
FIG. 6C is a cross-sectional diagram illustrating a process following the process in FIG. 6B.

FIG. 6A illustrates a cross-sectional structure of a semiconductor device 1B according to a second modification of the above-described semiconductor device 1. The semiconductor device 1B has a structure similar to that of the semiconductor device 1, except that a low-resistance wiring layer 37 is provided to cover the tip of the contact plug P. For example, the low-resistance wiring layer 37 may be configured of Cu, which is a material whose resistance is lower than that of Ta, and may be surrounded by the insulating film 63. According to the semiconductor device 1B, it is possible to reduce wiring resistance. The semiconductor device 1B may be manufactured as follows, for example. In a manner similar to that in the above-described first embodiment, for example, the entire structure may be covered with the insulating layer 60 (the insulating film 63) (see FIG. 4H). Subsequently, as illustrated in FIG. 6B, an opening 37K is formed in a region overlapping the region, in which the contact plug P is formed, of the insulating layer 60. Next, the low-resistance wiring layer 37 is formed by filling the opening 37K with a predetermined low-resistance material (FIG. 6C). Afterwards, the semiconductor device 1B may be completed in a manner similar to that of the above-described first embodiment. It is to be noted that the low-resistance wiring layer 37 may be formed together with the conductive layer 31 by, for example, a dual damascene method. In the dual damascene method, a wiring groove and a wiring aperture (via) are collectively formed, and then simultaneously filled with a low-resistance material such as Cu by plating or the like.

Second Embodiment

[Structure of Semiconductor Device 2]

Figure 7:
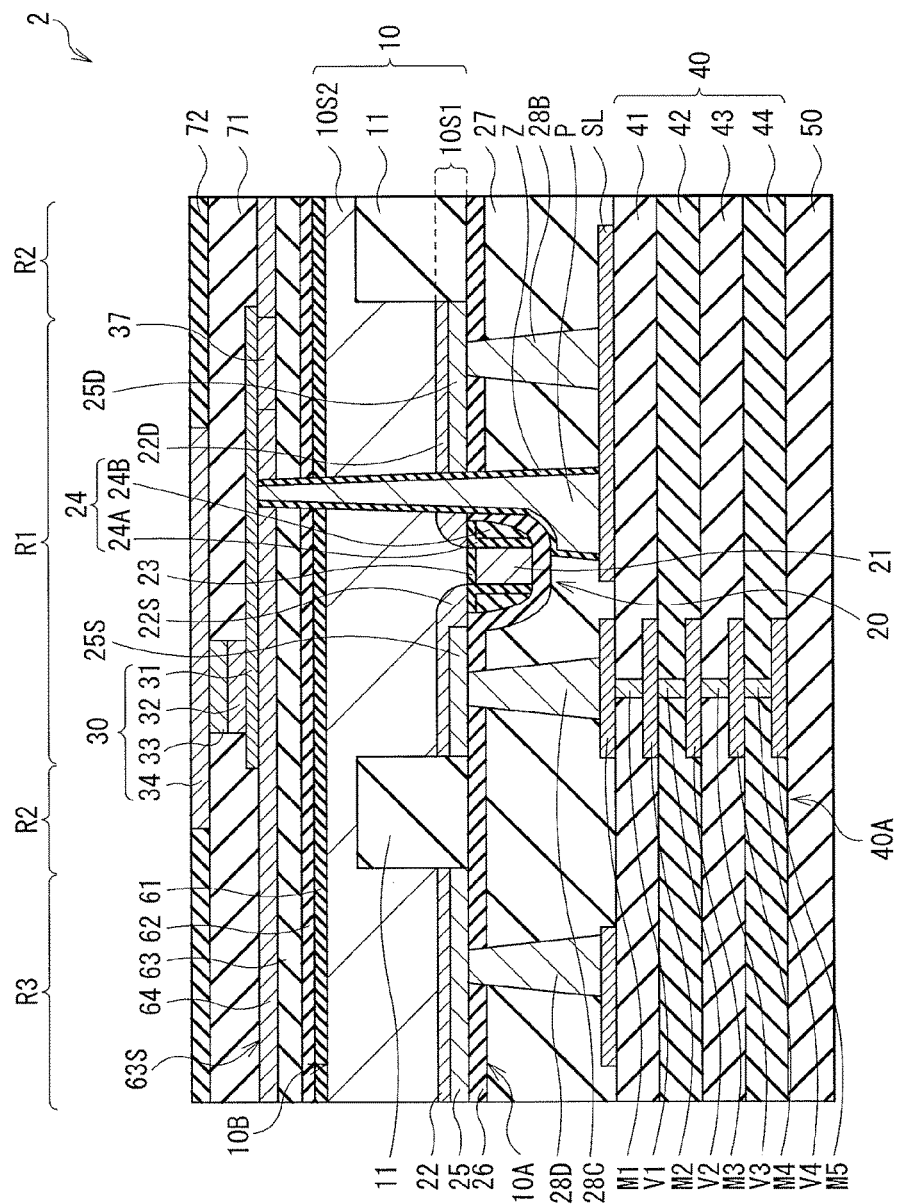
FIG. 7 is a cross-sectional diagram illustrating a semiconductor device according to a second embodiment of the present disclosure.

FIG. 7 illustrates a cross-sectional structure of a semiconductor device 2 according to a second embodiment of the present disclosure. The semiconductor device 2 has a structure in which a region where the contact plug P is formed partially overlaps a region where the gate electrode 21 is formed. Except this point, the semiconductor device 2 has a structure similar to that of the semiconductor device 1B illustrated in FIG. 6.

[Functions and Effects of Semiconductor Device 2]

The semiconductor device 2 as described above is also allowed to perform a function similar to that of the semiconductor device 1B of the above-described first embodiment. In other words, in the semiconductor device 2 as well, the contact plug P is covered by the insulating film Z and therefore, a short circuit with the gate electrode 21, etc. of the transistor 20 is avoided. In addition, an electric potential of the semiconductor substrate 10 is allowed to be set arbitrarily, and utilization of a substrate bias effect is allowed. Moreover, the semiconductor device 2 is allowed to have a smaller formation area of the element region R1 than that of the semiconductor device 1B, and therefore is allowed to be more compact.

[Modification 3]
[Structure of Semiconductor Device 2A]

Figure 8:
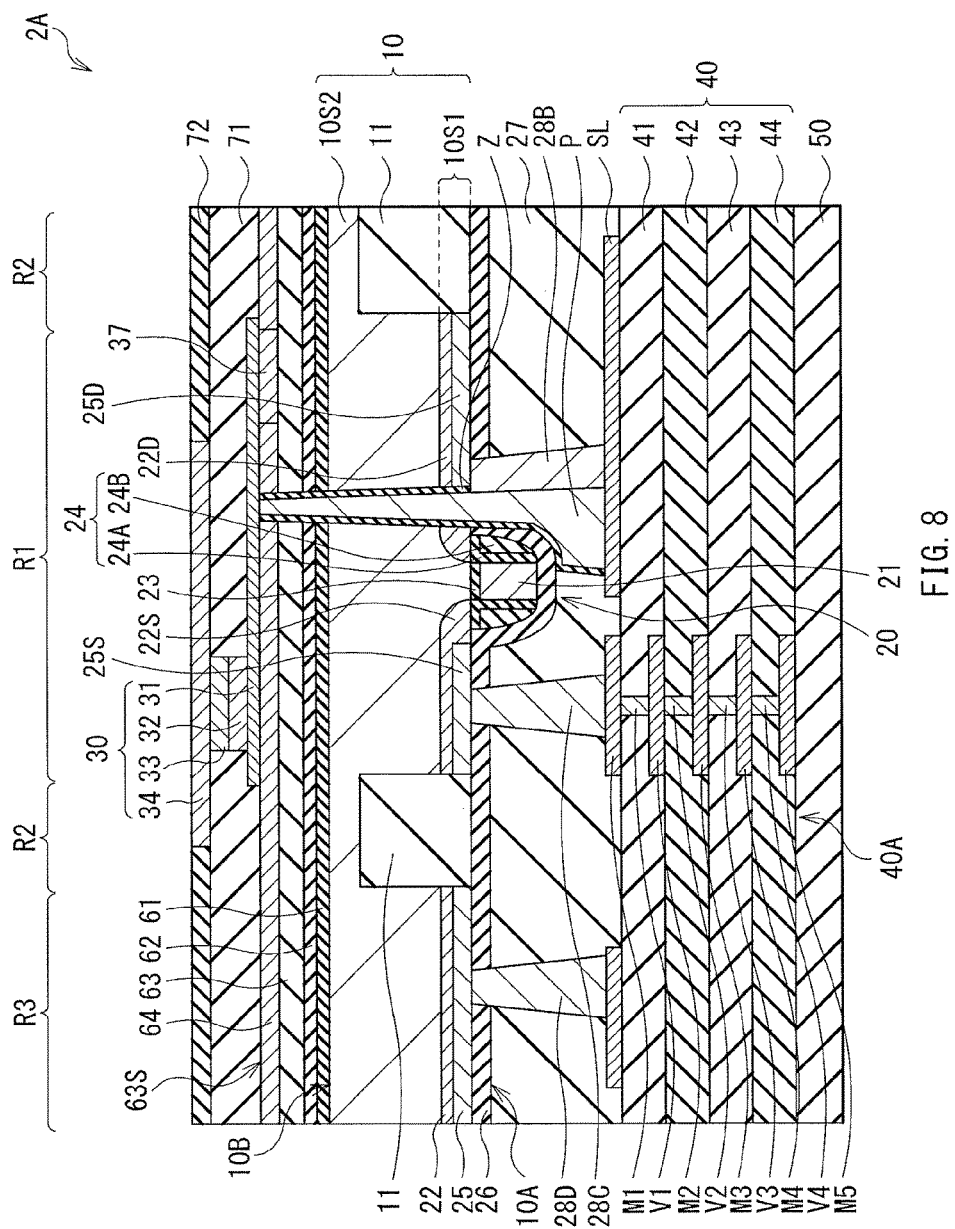
FIG. 8 is a cross-sectional diagram illustrating a modification of the semiconductor device according to the second embodiment of the present disclosure.

FIG. 8 illustrates a structure of a cross section of a semiconductor device 2A according to a modification of the above-described semiconductor device 2. The semiconductor device 2A is different from the semiconductor device 2 in that a part of the contact plug P is in contact with the connection layer 28B embedded in the interlayer insulating layer 27 to serve as the drain electrode, so that this part of the contact plug P is integral with the connection layer 28B. Therefore, an interface between the contact plug P and the connection layer 28B is not provided with the insulating film Z. Such a structure makes it possible to reduce the distance between the contact plug P and the connection layer 28B and therefore, a more compact layout is achievable.

[Method of Manufacturing Semiconductor Device 2A]

Figure 9A:
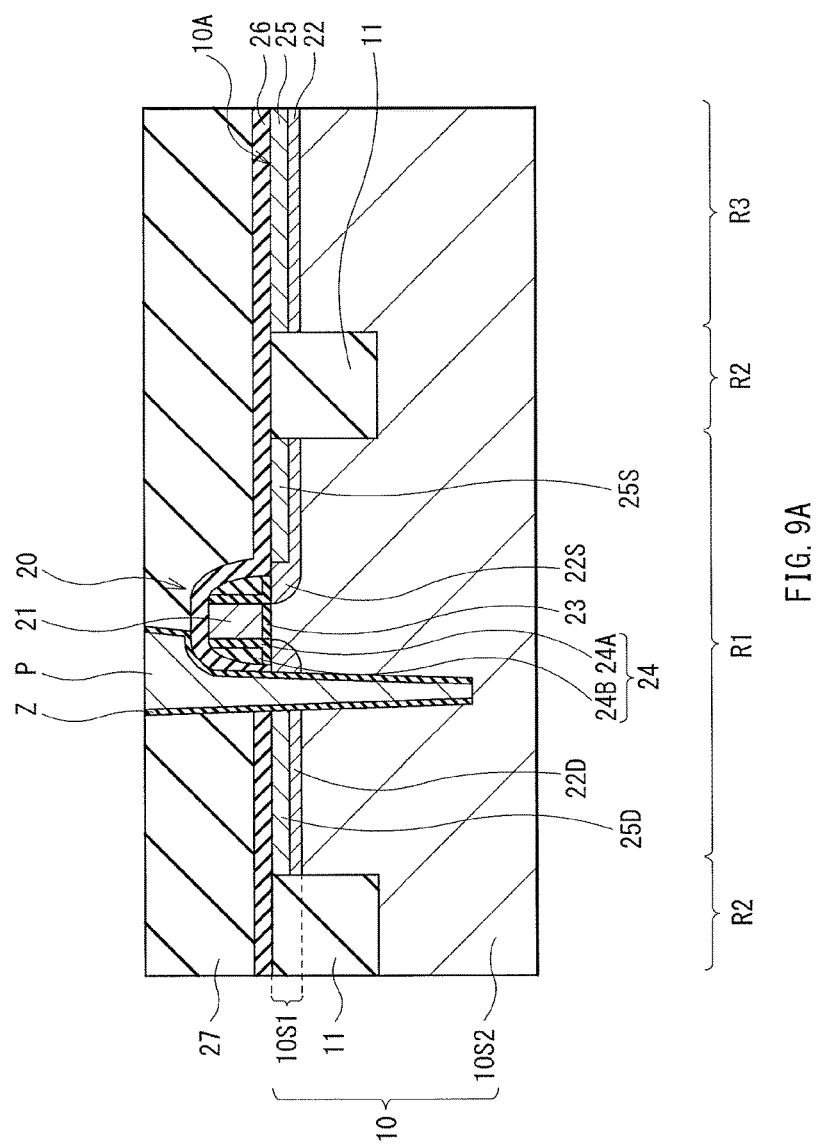
FIG. 9A is a cross-sectional diagram illustrating a process in a method of manufacturing the semiconductor device illustrated in FIG. 8.
Figure 9B:
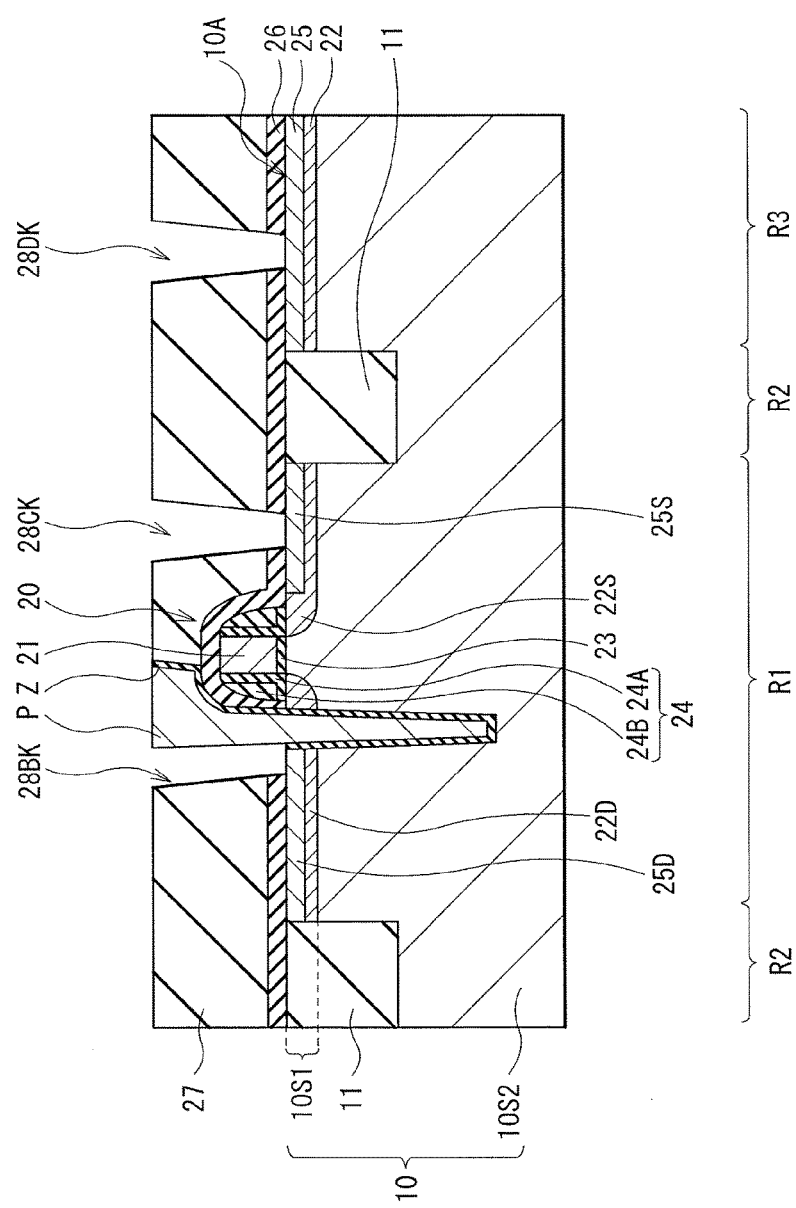
FIG. 9B is a cross-sectional diagram illustrating a process following the process in FIG. 9A.

FIGS. 9A and 9B each illustrate a part of a method of manufacturing the semiconductor device 2A in process order. First, as illustrated in FIG. 9A, the semiconductor substrate 10 is prepared, and then the insulating film Z and the contact plug P are formed to be partially disposed on the interlayer insulating layer 26 covering the gate electrode 21. Next, as illustrated in FIG. 9B, openings 28BK, 28CK, and 28DK are formed at predetermined positions where the connection layers 28B to 28D are to be formed, respectively. In this process, the opening 28BK is formed at the position adjacent to the contact plug P. When the opening 28BK is formed, a side face of the contact plug P is exposed by removing a part of the insulating film Z. Subsequently, the openings 28BK, 28CK, and 28DK are filled with a predetermined material, to form the connection layers 28B to 28D. Afterwards, in a procedure similar to that of the above-described first embodiment, the semiconductor device 2A is completed.

Third Embodiment

[Structure of Semiconductor Device 3]

Figure 10:
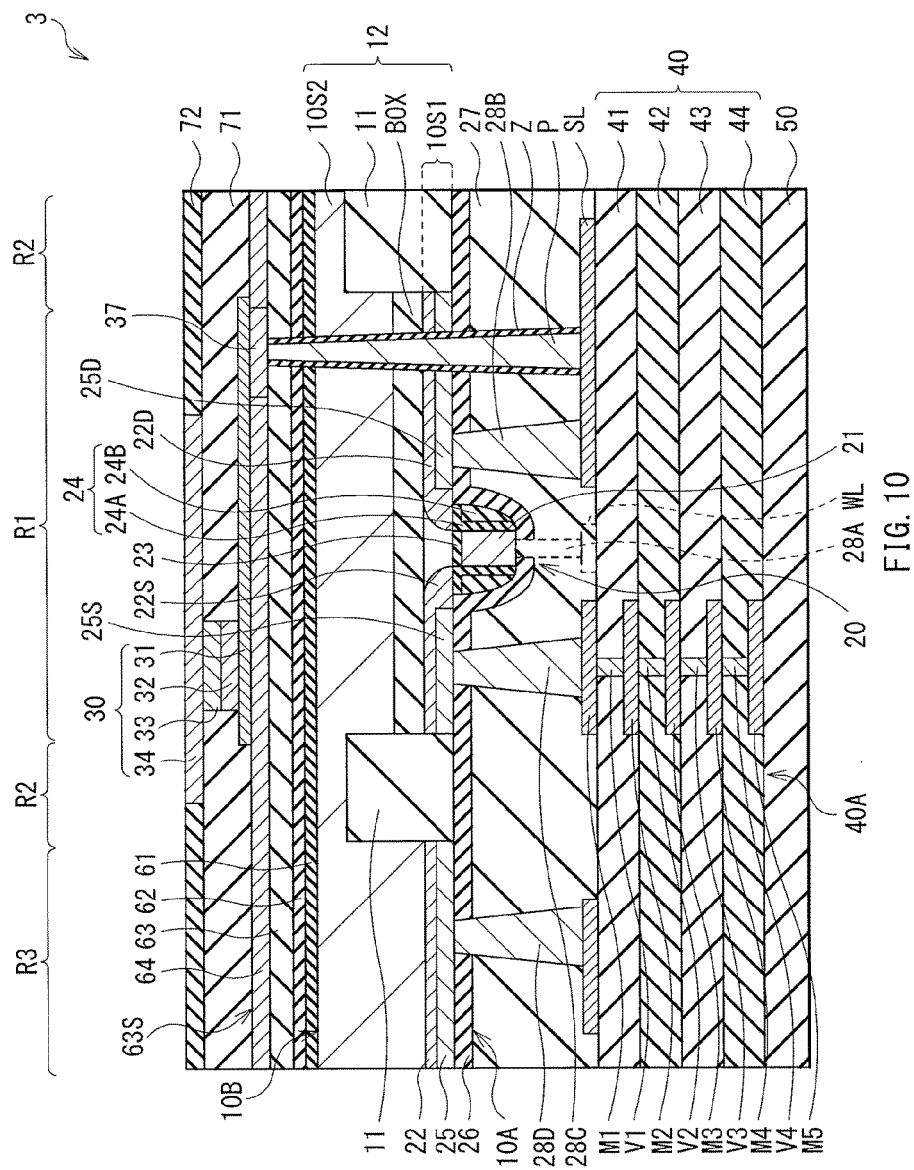
FIG. 10 is a cross-sectional diagram illustrating a semiconductor device according to a third embodiment of the present disclosure.

FIG. 10 illustrates a cross-sectional structure of a semiconductor device 3 according to a third embodiment of the present disclosure. The semiconductor device 3 includes a semiconductor substrate 12 having a SOI structure, and has is superior in operating speed, while achieving low power consumption. Specifically, the semiconductor substrate 12 has a laminated structure in which an embedded oxide film BOX is interposed between the semiconductor layers 10S1 and 10S2. The embedded oxide film BOX may be made of, for example, a silicon oxide film, and may have a thickness of, for example, about 20 nm. In the following description, components corresponding to those of the semiconductor device 1B of the above-described first embodiment will be provided with the same reference numerals as thereof.

[Method of Manufacturing Semiconductor Device 3]

Figure 11A:
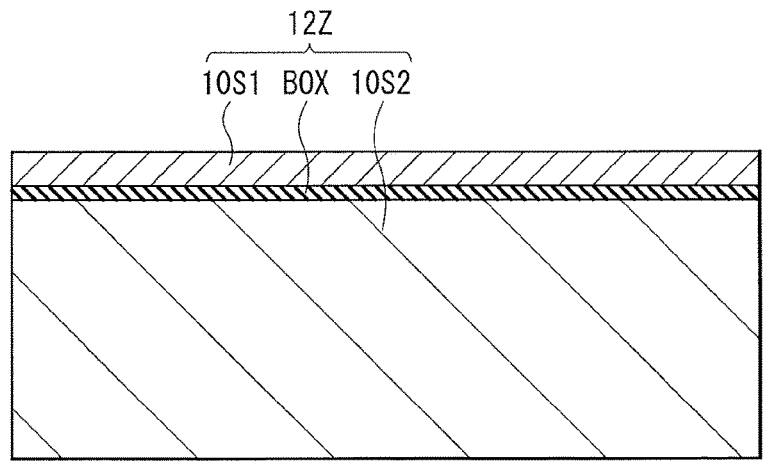
FIG. 11A is a cross-sectional diagram illustrating a process in a method of manufacturing the semiconductor device illustrated in FIG. 10.
Figure 11B:
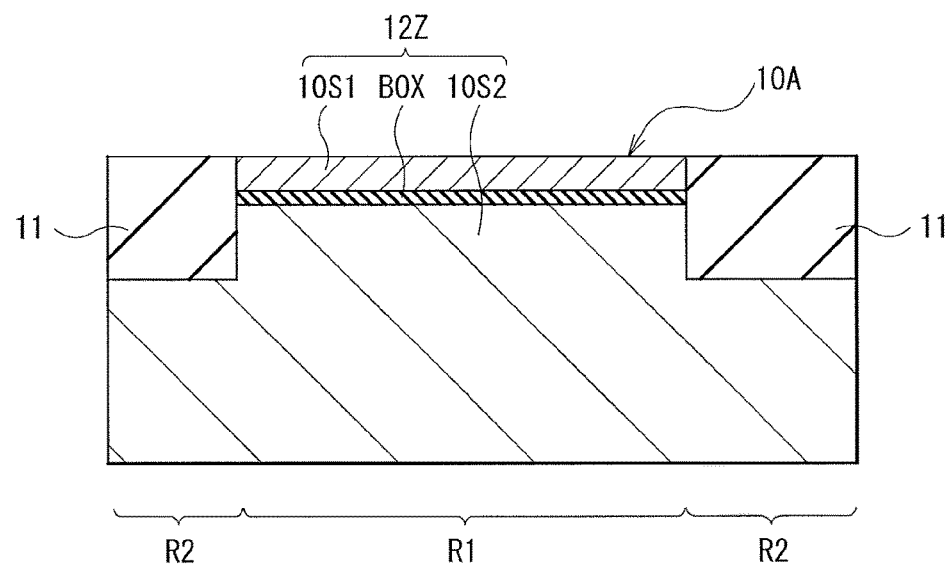
FIG. 11B is a cross-sectional diagram illustrating a process following the process in FIG. 11A.

FIGS. 11A and 11B each illustrate a part of a method of manufacturing the semiconductor device 3 in process order. First, as illustrated in FIG. 11A, a semiconductor substrate 12Z is prepared. In the semiconductor substrate 12Z, for example, the embedded oxide film BOX may be interposed between the semiconductor layers 10S1 and 10S2 made of single crystal silicon or the like. Next, as illustrated in FIG. 11B, in proximity to the main surface 10A of the semiconductor substrate 12Z in the separation region R2, the element separating layer 11 may be formed by STI, for example. Here, the semiconductor layer 10S1 and the embedded oxide film BOX in the separation region R2 are removed to form a groove extending to the semiconductor layer 10S2 (for example, having a depth of about 20 nm to about 300 nm). The groove is then filled with a predetermined material. Subsequently, ion implantation into the semiconductor layer 10S2 may be performed as necessary, so that a ground plane layer with high impurity concentration is provided in proximity to an interface, which is adjacent to the embedded oxide film BOX, of the semiconductor layer 10S2. Accordingly, the semiconductor substrate 12 is formed.

After the element separating layer 11 is formed, the semiconductor device 3 is completed by processes similar to those of the method of manufacturing the semiconductor device 1 in the above-described first embodiment.

[Functions and Effects of Semiconductor Device 3]

The semiconductor device 3 as described above is also allowed to perform a function similar to that of the semiconductor device 1 of the above-described first embodiment. In addition, in the semiconductor device 3 as well, an electric potential of the semiconductor substrate 12 is allowed to be set arbitrarily. Therefore, as with the semiconductor device 1 of the above-described first embodiment, an electric potential of the semiconductor substrate 12 is allowed to be fixed arbitrarily, or utilization of a substrate bias effect is allowed.

[Modification 4]

Figure 12:
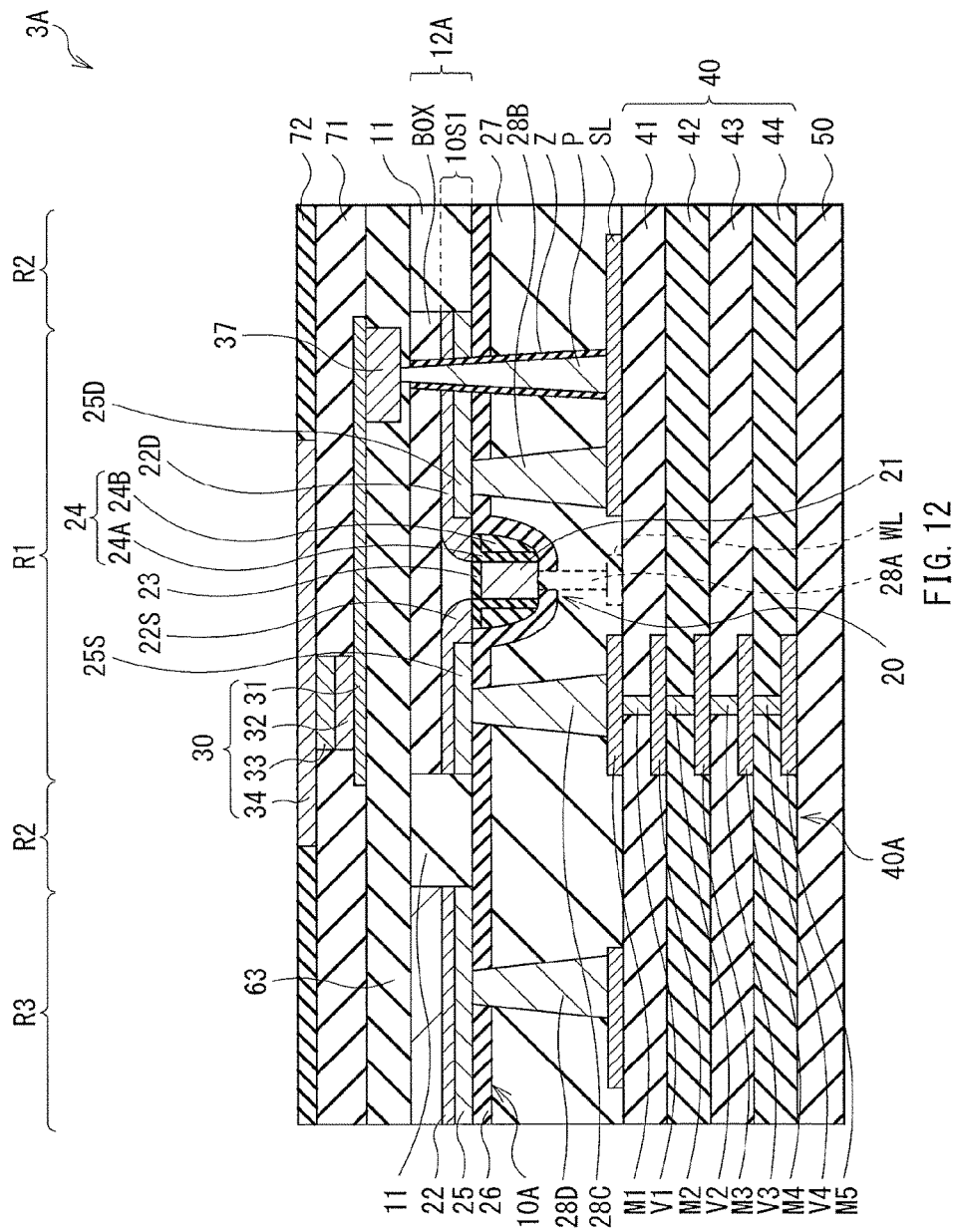
FIG. 12 is a cross-sectional diagram illustrating a modification of the semiconductor device according to the third embodiment of the present disclosure.

FIG. 12 illustrates a cross-sectional structure of a semiconductor device 3A according to a modification of the above-described semiconductor device 3. The semiconductor device 3A is different from the semiconductor device 3 in that a semiconductor substrate 12A is provided in place of the semiconductor substrate 12. The semiconductor substrate 12A has a SOI structure, but does not have the semiconductor layer 10S2. In other words, the semiconductor substrate 12A has, in the element region R1, a two-layer structure that includes the semiconductor layer 10S1 covering the transistor 20, and the embedded oxide film BOX covering the entire surface of the semiconductor layer 10S1. The entire surface of the embedded oxide film BOX is covered by an insulating layer 63.

In the above-described semiconductor device 3A as well, it is possible to dispose the transistors 20 more in a smaller region while ensuring flexibility in design and therefore, higher integration is achievable.

Fourth Embodiment

[Structure of Semiconductor Device 4]

Figure 13:
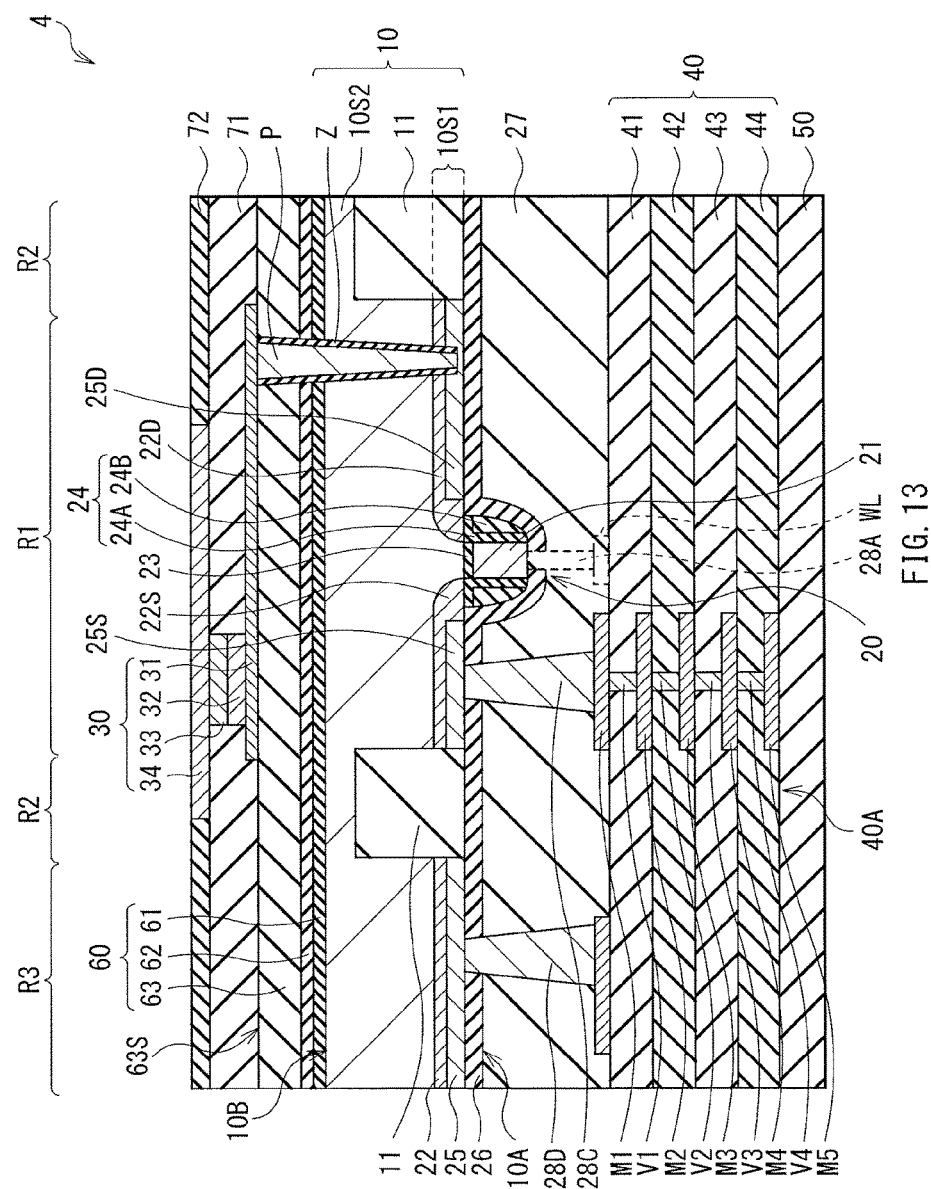
FIG. 13 is a cross-sectional diagram illustrating a semiconductor device according to a fourth embodiment of the present disclosure.

FIG. 13 illustrates a cross-sectional structure of a semiconductor device 4 according to a fourth embodiment of the present disclosure. In the semiconductor device 4, one end (the lower end) of the contact plug P is connected to the silicide region 25D in the diffusion layer 22D. In other words, the contact plug P serves as the drain electrode that directly connects the memory element 30 to the silicide region 25D. It is to be noted that, in FIG. 13, the contact plug P is in contact with the silicide region 25D and serves as the drain electrode. However, the contact plug P may be in contact with the silicide region 25S in the diffusion layer 22S, to serve as the source electrode.

[Method of Manufacturing Semiconductor Device 4]

Figure 14A:
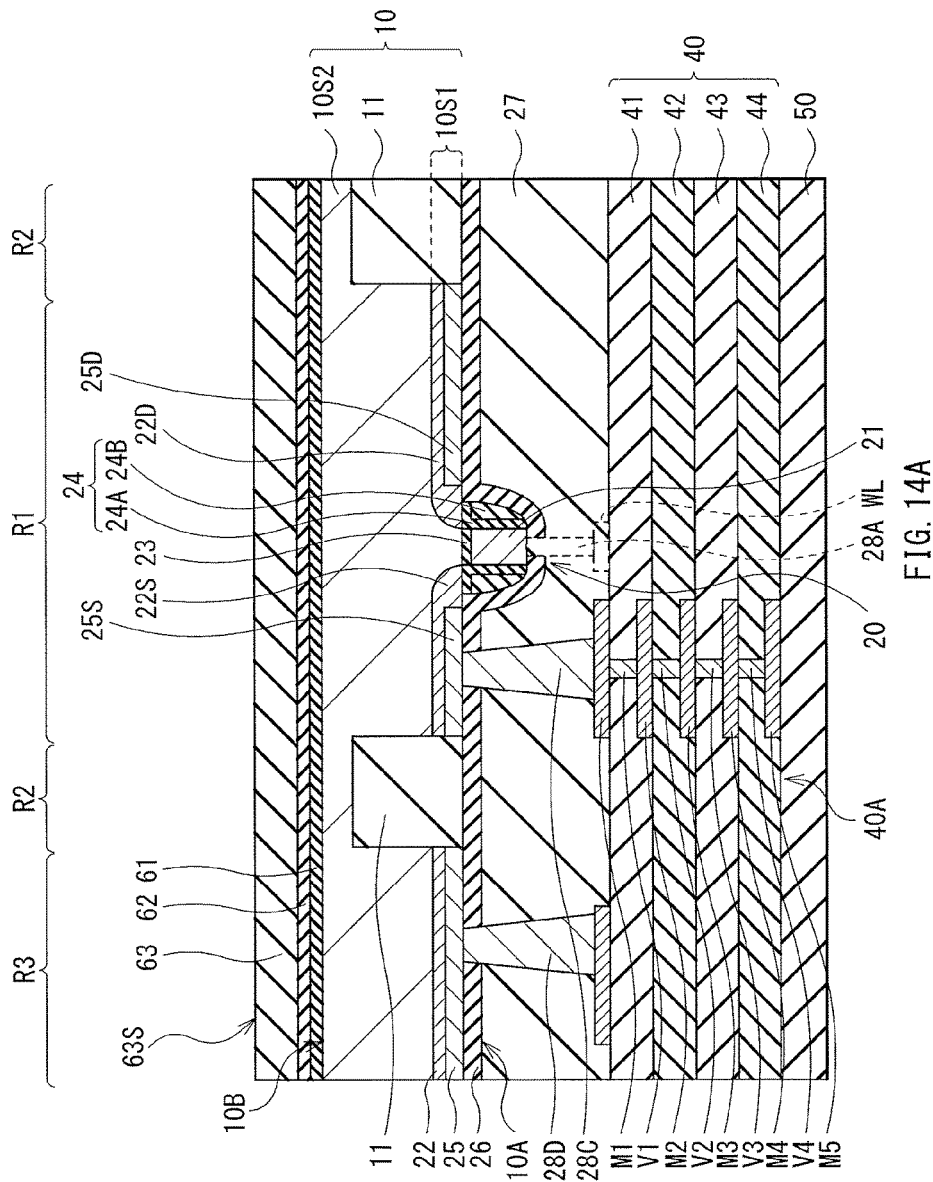
FIG. 14A is a cross-sectional diagram illustrating a process in a method of manufacturing the semiconductor device illustrated in FIG. 13.

The semiconductor device 4 may be manufactured as follows, for example. FIGS. 14A to 14D each illustrate a part of a method of manufacturing the semiconductor device 4 in process order. First, the transistor 20 to the insulating layer 60 are formed in a manner similar to that in the method of manufacturing the semiconductor device 1 of the first embodiment, except that the connection layer 28B, the select line SL, the contact plug P, and the insulating film Z are not formed (FIG. 14A).

Figure 14B:
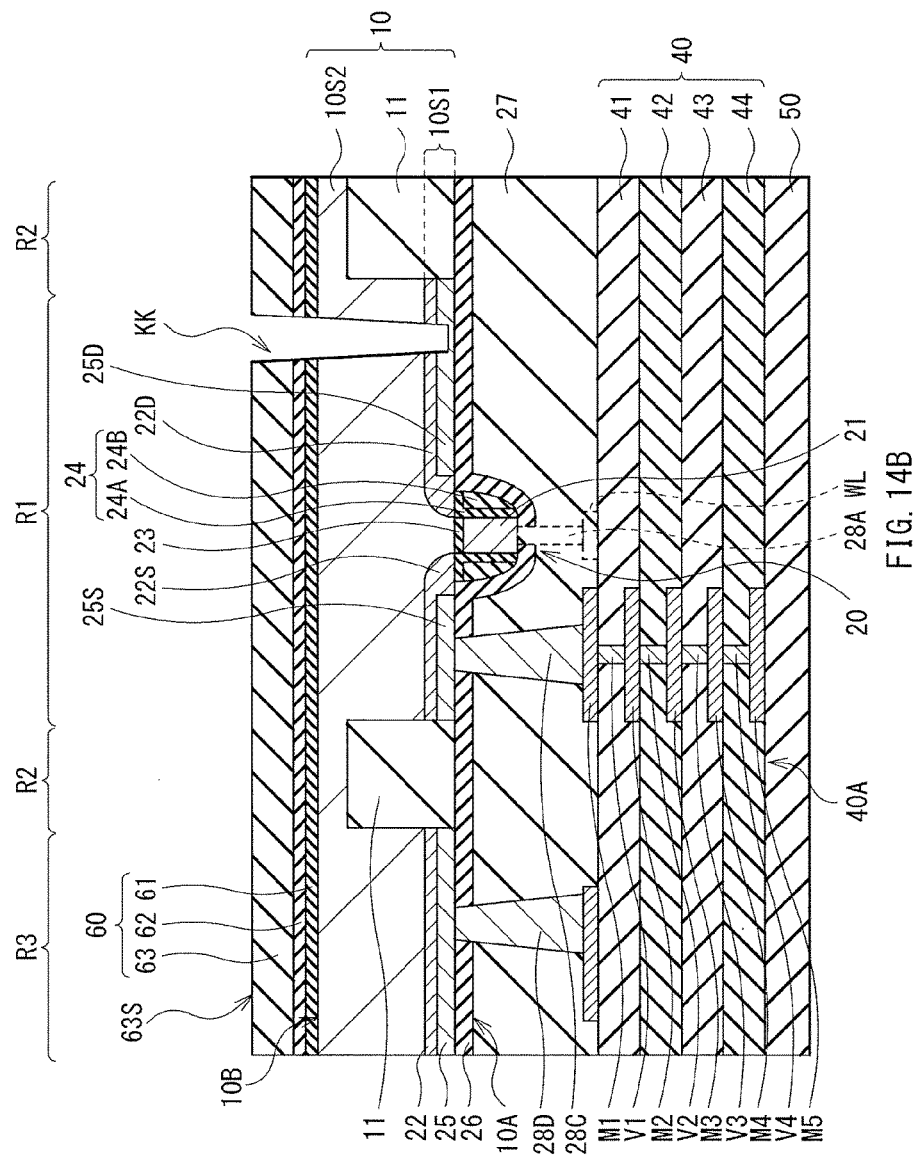
FIG. 14B is a cross-sectional diagram illustrating a process following the process in FIG. 14A.
Figure 14C:
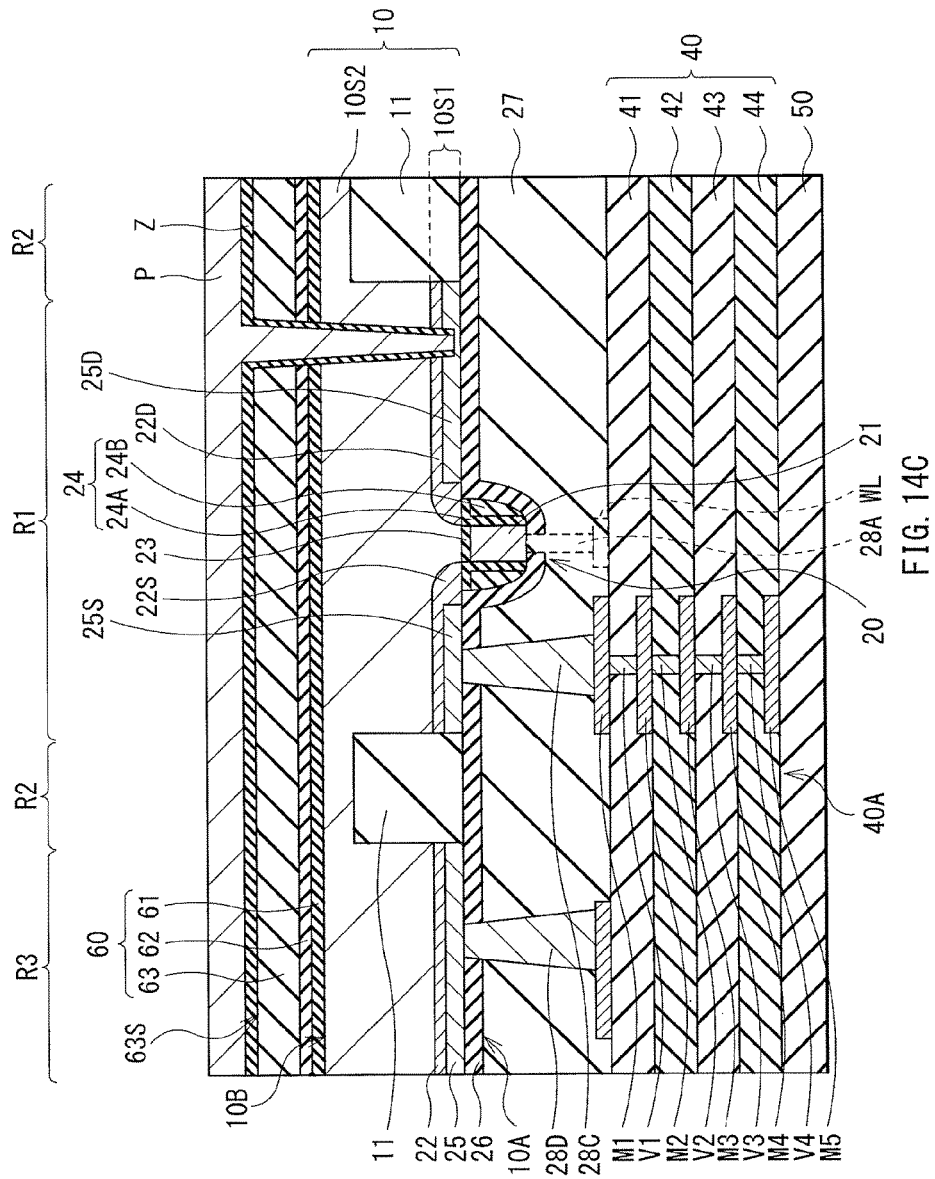
FIG. 14C is a cross-sectional diagram illustrating a process following the process in FIG. 14B.

Next, as illustrated in FIG. 14B, a through hole KK extending to the silicide region 25D is formed. Subsequently, as illustrated in FIG. 14C, the insulating film Z is formed to cover a wall surface of the through hole KK. At this moment, the insulating film Z also covers a top surface of the insulating film 63. Further, the contact plug P is formed by filling inside of the through hole KK whose wall surface is covered by the insulating film Z, with a metallic material. At this moment, the metallic material is also formed on the insulating film Z covering the top surface of the insulating film 63.

Figure 14D:
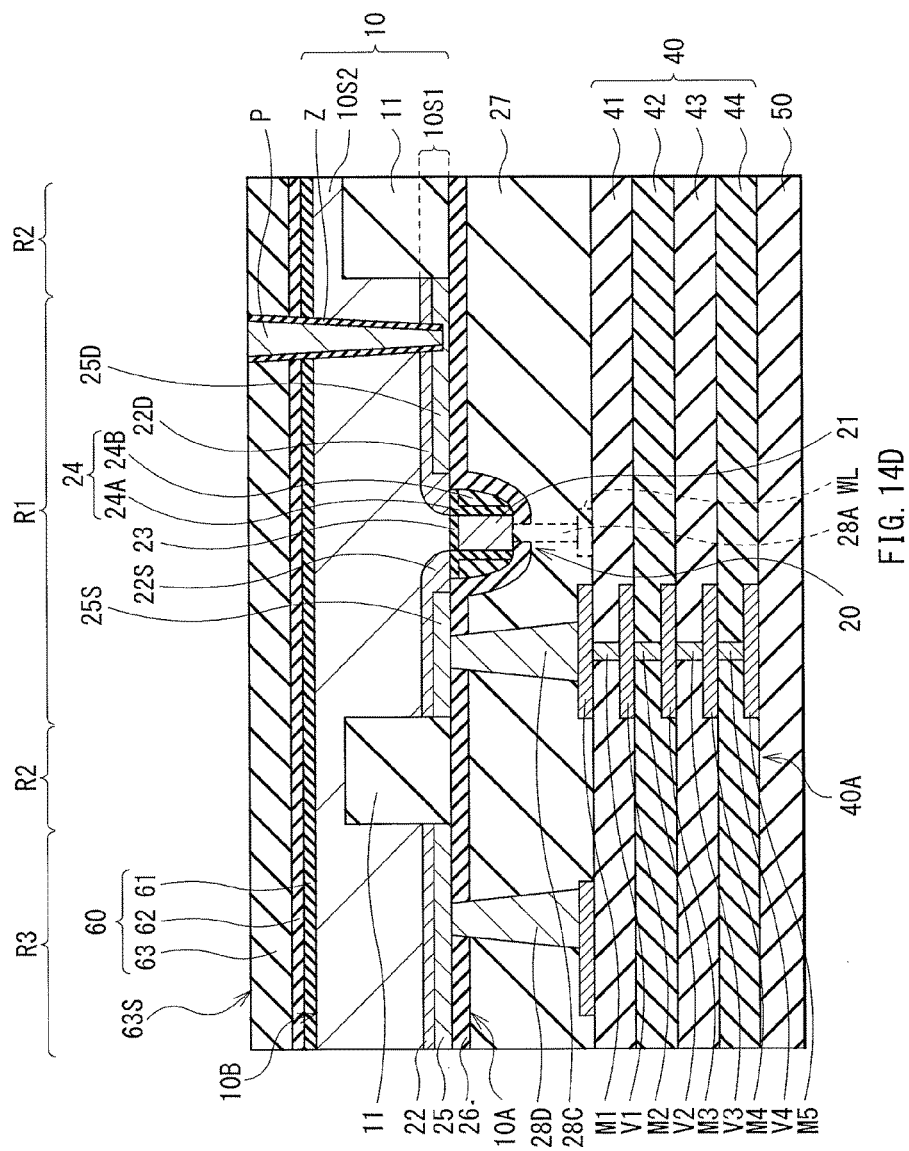
FIG. 14D is a cross-sectional diagram illustrating a process following the process in FIG. 14C.

Next, as illustrated in FIG. 14D, a part which covers the top surface of the insulating film 63, of the insulating film Z and the metallic material is removed by CMP or etch back. As a result, only a part which fills the through hole KK, of the insulating film Z and the metallic material remains, so that the contact plug P whose periphery is covered by the insulating film Z is completed. Afterwards, the semiconductor device 4 is completed by a procedure similar to that of the above-described first embodiment.

[Functions and Effects of Semiconductor Device 4]

The above-described semiconductor device 4 may also be expected to produce effects similar to those of the semiconductor device 1 of the above-described first embodiment. In addition, in the semiconductor device 4 as well, an electric potential of the semiconductor substrate 10 is allowed to be set arbitrarily. Therefore, as with the semiconductor device 1 of the above-described first embodiment, an electric potential of the semiconductor substrate 10 is allowed to be fixed arbitrarily, or utilization of a substrate bias effect is allowed.

Fifth Embodiment

Figure 15:
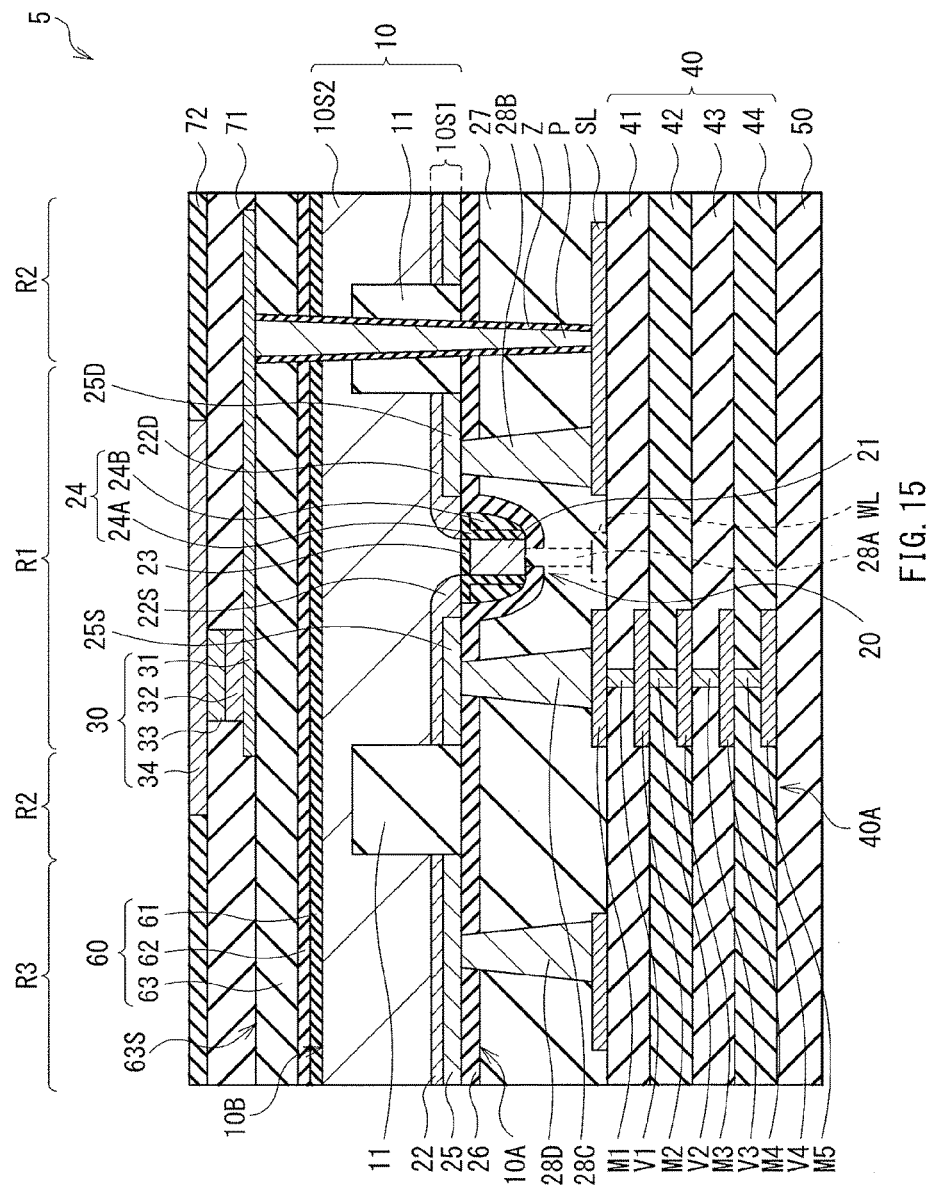
FIG. 15 is a cross-sectional diagram illustrating a semiconductor device according to a fifth embodiment of the present disclosure.

FIG. 15 illustrates a cross-sectional structure of a semiconductor device 5 according to a fifth embodiment of the present disclosure. The semiconductor device 5 has a structure in which the contact plug P covered by the insulating film Z passes through the separation region R2, not the element region R1. In other words, the contact plug P is provided in the separation region R2, to pass through the insulating layer 60, the semiconductor layer 10S2, the element separating layer 11, the interlayer insulating layer 26, and the interlayer insulating layer 27 in this order. The lower end of the contact plug P is in contact with the select line SL, and the upper end thereof is in contact with the conductive layer 31 of the memory element 30. The above-described semiconductor device 5 may also be expected to produce effects similar to those of the semiconductor device 1 of the above-described first embodiment. In addition, an electric potential of the semiconductor substrate 10 is allowed to be set arbitrarily in the semiconductor device 5 as well. Therefore, as with the semiconductor device 1 of the above-described first embodiment, an electric potential of the semiconductor substrate 10 is allowed to be fixed arbitrarily, or utilization of a substrate bias effect is allowed.

Sixth Embodiment

[Structure of Semiconductor Device 6]

Figure 16A:
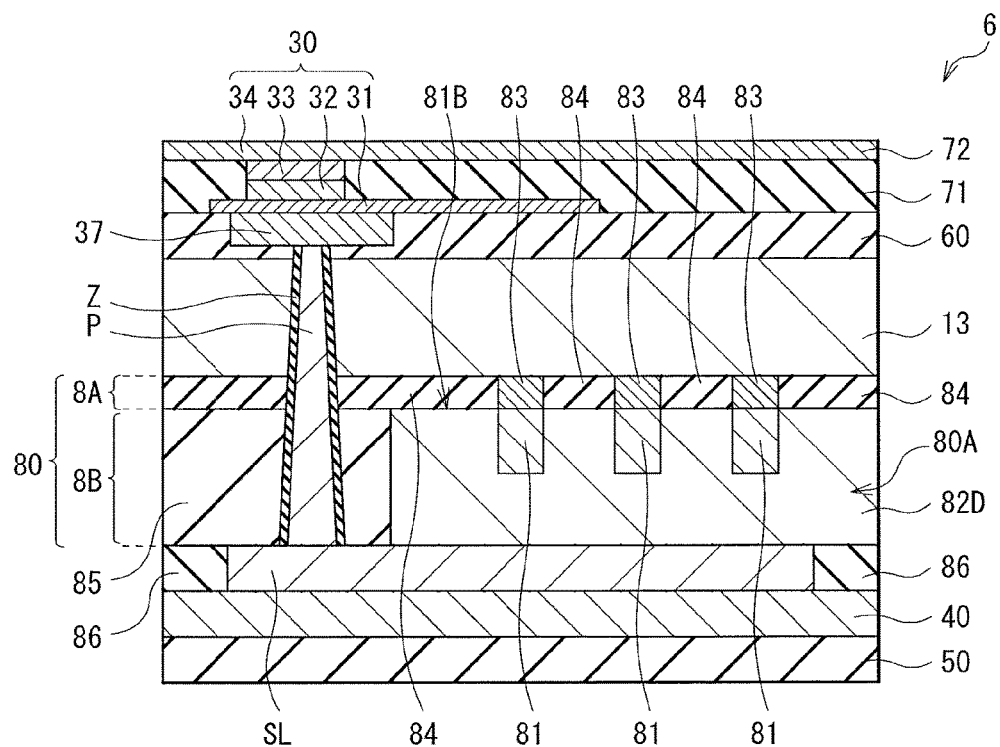
FIG. 16A is a cross-sectional diagram illustrating a semiconductor device according to a sixth embodiment of the present disclosure.
Figure 16B:
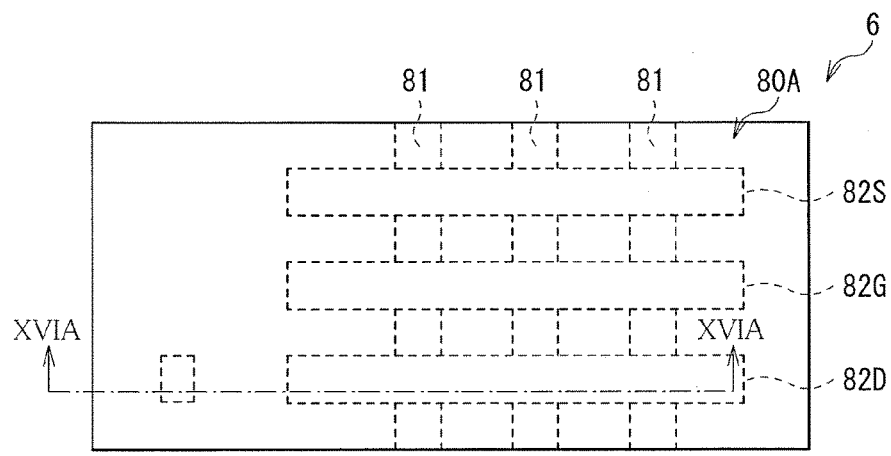
FIG. 16B is a plan view illustrating the semiconductor device illustrated in FIG. 16A.

FIG. 16A illustrates a cross-sectional structure of a semiconductor device 6 according to a sixth embodiment of the present disclosure. FIG. 16B illustrates a plane structure of the semiconductor device 6. FIG. 16A corresponds to a cross-sectional diagram taken along a cutting-plane line XVIA-XVIA and viewed in an arrow direction illustrated in FIG. 16B. The semiconductor device 6 includes a transistor 80A in place of the transistor 20. The transistor 80A may be, for example, embedded in an element formation layer 80 interposed between a semiconductor substrate 13 made of silicon and the multilayered wiring formation section 40 (FIG. 16A). An insulating layer 86 occupies a part around the select line SL. It is to be noted that, in FIG. 16A, illustration of the tap region R3 is omitted, and a detailed structure of the multilayered wiring formation section 40 is also simplified. Further, in the following description, components corresponding to those of the semiconductor device 1 of the above-described first embodiment will be provided with the same reference numerals as those thereof.

The element formation layer 80 has a first layer 8A and a second layer 8B, in this order from the semiconductor substrate 13 side. The first layer 8A includes a semiconductor portion 83 that occupies a first region extending in a first direction (here, a direction orthogonal to a sheet surface). The first layer 8A further includes an insulator portion 84 that occupies a second region excluding the first region. In the second layer 8B, fins 81, a gate wiring 82G, a source wiring 82S, and a drain wiring 82D are embedded in an insulating layer 85. The fins 81 are provided to stand on the semiconductor portion 83 and made of Si (silicon). The gate wiring 82G, the source wiring 82S, and the drain wiring 82D cover a surface of the fin 81 except a back surface thereof, and extend in a second direction (a lateral direction on the sheet surface). The source wiring 82S and the drain wiring 82D are connected to one end of the contact plug P through the select line SL. The transistor 80A is a select transistor of the memory element 30, and may be a fin field-effect transistor (Fin-FET) having the fins 81, as well as the gate wiring 82G, the source wiring 82S, and the drain wiring 82D. Use of the Fin-FET makes it possible to suppress short-channel properties, as compared with a planar-type transistor on a bulk substrate. The gate wiring 82G also serves as the word line WL of the memory element 30.

The fins 81 may each be, for example, flat-shaped, and provided to stand on the semiconductor substrate 13 made of silicon. The gate wiring 82G, the source wiring 82S, and the drain wiring 82D are all extended in a direction intersecting an extending direction of the fins 81, to straddle the fins 81. The gate wiring 82G, the source wiring 82S, and the drain wiring 82D each cover the surface of the fin 81 except the back surface thereof, namely, the surface of the fin 81 except the surface in contact with the semiconductor substrate 13.

[Functions and Effects of Semiconductor Device 6]

The above-described semiconductor device 6 may also be expected to produce effects similar to those of the semiconductor device 1 of the above-described first embodiment. In addition, in the semiconductor device 6 as well, an electric potential of the semiconductor substrate 13 is allowed to be set arbitrarily. Therefore, as with the semiconductor device 1 of the above-described first embodiment, an electric potential of the semiconductor substrate 13 is allowed to be fixed arbitrarily, or utilization of a substrate bias effect is allowed.

Further, in the present embodiment, the transistor 80A that is the Fin-FET having high current drive ability is mounted and used as the select transistor of the memory element 30. Therefore, high-speed reading and writing are allowed.

[Modification 5]

Figure 17:
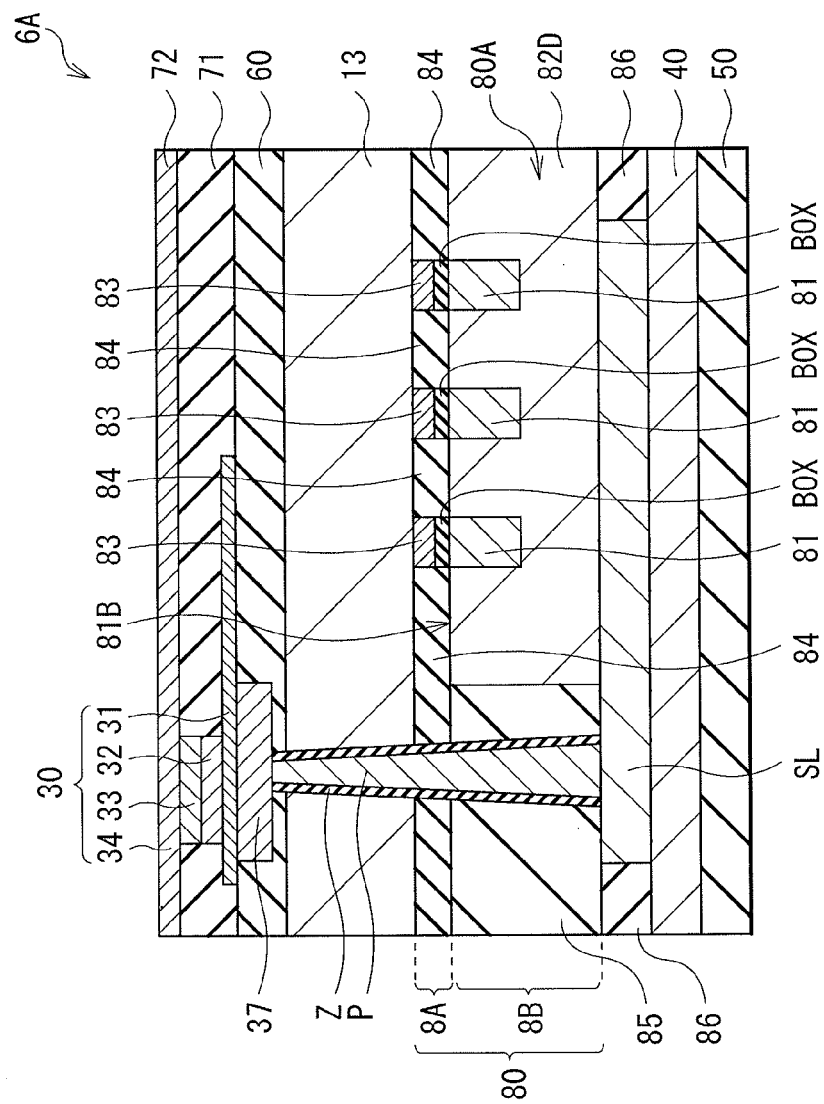
FIG. 17 is a cross-sectional diagram illustrating a modification of the semiconductor device according to the sixth embodiment of the present disclosure.

FIG. 17 illustrates a cross-sectional structure of a semiconductor device 6A according to a modification of the above-described semiconductor device 6. The semiconductor device 6A is different from the semiconductor device 6 in that the embedded oxide film BOX in contact with a back surface 81B of the fin 81 is provided in the semiconductor portion 83 in the first layer 8A. In other words, the back surfaces of the fin 81, the gate wiring 82G, the source wiring 82S, and the drain wiring 82D are all in contact with the embedded oxide film BOX.

In this way, the semiconductor device 6A includes the semiconductor substrate 13 having a SOI structure, and may be expected to realize a high operating speed while achieving low power consumption.

Seventh Embodiment

Figure 18:
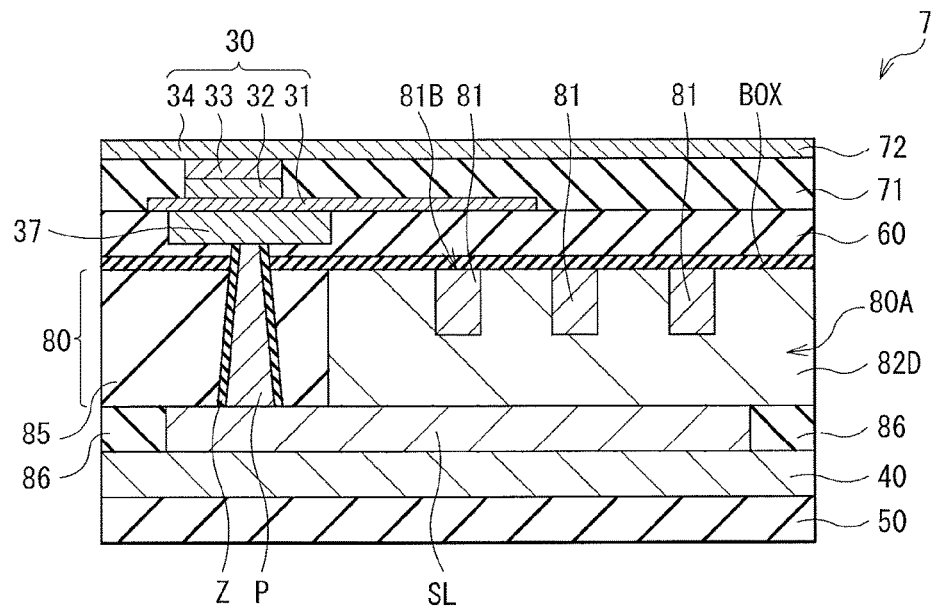
FIG. 18 is a cross-sectional diagram illustrating a semiconductor device according to a seventh embodiment of the present disclosure.

FIG. 18 illustrates a cross-sectional structure of a semiconductor device 7 according to a seventh embodiment of the present disclosure. In the following description, components corresponding to those of the semiconductor device 6 of the above-described sixth embodiment will be provided with the same reference numerals as those thereof.

The semiconductor device 7 includes the insulating layer 60, the embedded oxide film BOX provided on the insulating layer 60, and the element formation layer 80 provided on the embedded oxide film BOX. Further, the contact plug P is provided to pass through the element formation layer 80 and the embedded oxide film BOX. The insulating film Z covers the periphery of the contact plug P. The transistor 80A is embedded in the element formation layer 80.

The transistor 80A includes the fins 81, the gate wiring 82G (not illustrated), the source wiring 82S (not illustrated), and the drain wiring 82D. The fins 81 are provided to stand on the embedded oxide film BOX and to extend in a first direction (here, a direction orthogonal to a sheet surface). The gate wiring 82G the source wiring 82S, and the drain wiring 82D cover the surface of the fin 81 except the back surface 81B thereof, and extend in a second direction (a lateral direction on the sheet surface) intersecting the first direction. Further, the source wiring 82S or the drain wiring 82D is connected to one end of the contact plug P.

In this way, the semiconductor device 7 has a SOI structure and therefore may be expected to realize a high operating speed while achieving low power consumption.

Eighth Embodiment

Figure 19:
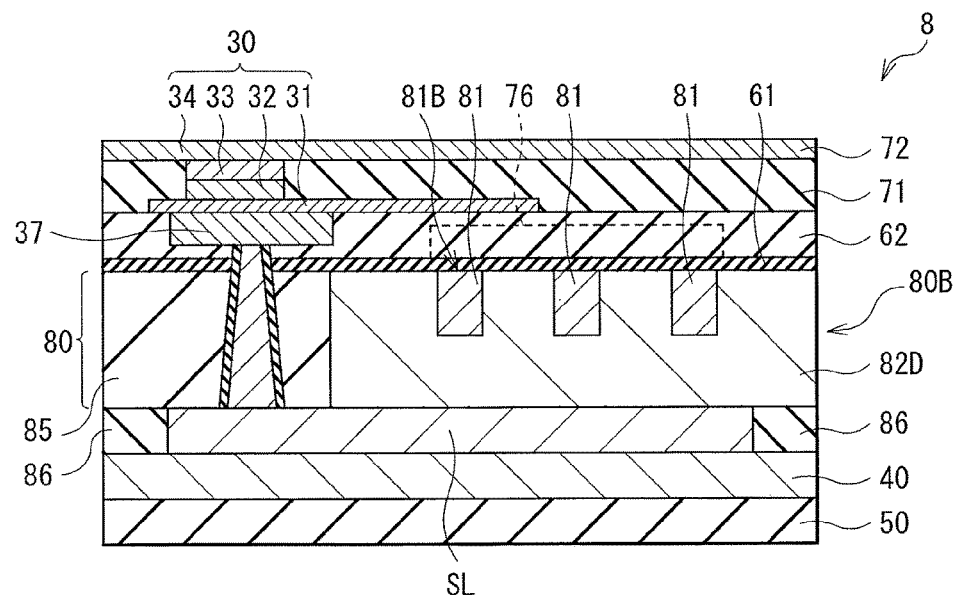
FIG. 19 is a cross-sectional diagram illustrating a semiconductor device according to an eighth embodiment of the present disclosure.

FIG. 19 illustrates a cross-sectional structure of a semiconductor device 8 according to an eighth embodiment of the present disclosure. The semiconductor device 8 is different from the semiconductor device 7 of the above-described seventh embodiment in that a transistor 80B that is a nano-wire FET is provided. Specifically, in the semiconductor device 8, in place of the embedded oxide film BOX in the semiconductor device 7, the insulating films 61 and 62 are laminated to cover the back surface 81B of the fin 81. The insulating film 61 may be made of, for example, a High-K (high dielectric) film capable of being formed at a low temperature, and the insulating film 62 may be made of, for example, $SiO_2$. Alternatively, the insulating film 62 may be configured of a material (Low-K) having a dielectric constant lower than that of $SiO_2$. Further, a fourth gate electrode 76 is provided to face the back surface 81B of the fin 81, with the insulating film 61 interposed therebetween. The fourth gate electrode 76 is covered by the insulating film 62. The semiconductor device 8 is otherwise similar to the semiconductor device 7 in terms of structure.

In the above-described semiconductor device 8 as well, it is possible to dispose the transistors 80B more in a smaller region while ensuring flexibility in design and therefore, higher integration is achievable.

The present disclosure has been described with reference to some embodiments and modifications, but is not limited thereto, and may be variously modified. For example, in the above-described embodiments, the case in which the contact plug P is connected to the connection layer 28B serving as the drain electrode through the select line SL has been taken as an example, but the present technology is not limited thereto. For example, the contact plug P may be connected to the connection layer 28C serving as the source electrode. Alternatively, both the contact plug P connected to the connection layer 28B and the other contact plug P connected to the connection layer 28C may be provided.

For example, in the above-described embodiments, the structures of the transistors 20, 80A, and 80B as well as the memory element 30 have been described specifically. However, all the components may not be provided necessarily, and other component may be further provided.

It is to be noted that the effects described in the present specification are merely examples without limitation, and other effects may be obtained. Moreover, the present technology may be configured as follows.

(1) A semiconductor device including:
- a semiconductor substrate including a first surface and a second surface facing each other, the semiconductor substrate having an element region in which a transistor is provided on the first surface, and a separation region in which an element separating layer surrounding the element region is provided;
- a contact plug extending from the first surface to the second surface, in the element region of the semiconductor substrate; and
- an insulating film covering a periphery of the contact plug.

(2) The semiconductor device according to (1), further including a memory element provided on the second surface of the semiconductor substrate, with an insulating layer interposed therebetween,
  wherein a first end of the contact plug is connected to the memory element.

(3) The semiconductor device according to (2), wherein the memory element is a spin transfer torque-magnetic tunnel junction (STT-MTJ) element.

(4) The semiconductor device according to (2), wherein the transistor includes
- a pair of diffusion layers forming a part of the semiconductor substrate,
- a source electrode and a drain electrode having respective first ends connected to the pair of diffusion layers, respectively,
- a gate electrode provided to face a channel region with a gate insulating film interposed therebetween, the channel region being provided between the pair of diffusion layers,
- the first surface of the semiconductor substrate is covered by an interlayer insulating layer, and
- the contact plug passes through all of the insulating layer, the semiconductor substrate, and the interlayer insulating layer.

(5) The semiconductor device according to (4), wherein
the source electrode and the drain electrode also pass
through the interlayer insulating layer, and
a second end of the source electrode or a second end of the
drain electrode is connected to a second end of the
contact plug.
(6) The semiconductor device according to (4) or (5),
wherein the contact plug passes through the pair of diffusion
layers.
(7) The semiconductor device according to any one of (2)
to (6), wherein an occupation area of the contact plug
becomes smaller from the first surface to the second surface.
(8) The semiconductor device according to (2), wherein
the semiconductor substrate has a laminated structure
including
a first semiconductor layer provided in the element
region,
an embedded oxide film covering the first semiconductor
layer,
a second semiconductor layer covering both the embedded oxide film and the element separating layer, and
the contact plug passes through the first semiconductor
layer, the embedded oxide film, and the second semiconductor layer.
(9) The semiconductor device according to (2), wherein
the semiconductor substrate includes an embedded oxide
film covering the transistor in the element region, and
the insulating layer covers both the embedded oxide film
and the element separating layer.
(10) A semiconductor device including:
a semiconductor substrate;
an element formation layer including a transistor provided
on the semiconductor substrate;
a contact plug passing through the element formation
layer and the semiconductor substrate; and
an insulating film covering a periphery of the contact
plug,
wherein the element formation layer has a first layer, a fin,
and a second layer, the first layer including a semiconductor portion and an insulator portion, the semiconductor portion occupying a first region extending in a
first direction, the insulator portion occupying a second
region excluding the first region, the fin being provided
to stand on the semiconductor portion, and the second
layer including a gate wiring, a source wiring, and a
drain wiring that cover a surface of the fin except a back
surface of the fin and extend in a second direction, and
the source wiring or the drain wiring is connected to one
end of the contact plug.
(11) The semiconductor device according to (10), wherein
the semiconductor portion in the first layer is provided with
an embedded oxide film in contact with the back surface of
the fin.
(12) A semiconductor device including:
an insulating layer;
an embedded oxide film provided on the insulating layer;
an element formation layer including a transistor provided
on the embedded oxide film;
a contact plug passing through the element formation
layer, the embedded oxide film, and a semiconductor
substrate; and
an insulating film covering a periphery of the contact
plug,
wherein the transistor includes
a fin, a gate wiring, a source wiring, and a drain wiring,
the fin being provided to stand on the embedded oxide
film and extending in a first direction, and the gate
wiring, the source wiring, and the drain wiring each
covering a surface of the fin except a back surface of
the fin and extending in a second direction, and
the source wiring or the drain wiring is connected to one
end of the contact plug.
(13) The semiconductor device according to any one of
(5) to (9), wherein the contact plug is provided to also cover
a region overlapping a region where the gate electrode is
formed.
(14) The semiconductor device according to (13), wherein
the source electrode or the drain electrode is integral with the
contact plug and passes through the interlayer insulating
layer.
(15) The semiconductor device according to (2), wherein
the transistor includes
a pair of diffusion layers forming a part of the semiconductor substrate,
a source electrode and a drain electrode having respective
first ends connected to the pair of diffusion layers,
respectively,
a gate electrode provided to face a channel region with a
gate insulating film interposed therebetween, the channel region being provided between the pair of diffusion
layers, and
the contact plug is one or both of the source electrode and
the drain electrode.
(16) The semiconductor device according to (15), wherein
an occupation area of the contact plug becomes smaller from
the first surface to the second surface.
(17) A method of manufacturing a semiconductor device,
the method including:
preparing a semiconductor substrate including a first
surface and a second surface facing each other, the
semiconductor substrate having an element region in
which a transistor is provided on the first surface, and
a separation region in which an element separating
layer surrounding the element region is provided;
forming an insulating film covering a wall surface of a
through hole, after forming the through hole by hollowing out the semiconductor substrate from the first
surface towards the second surface in the element
region of the semiconductor substrate; and
forming a contact plug by filling the through hole covered
by the insulating film, with a metallic material.
(18) The method according to (17), further including
forming an insulating layer covering a whole, after reducing a thickness of the semiconductor substrate by
performing etch back on the second surface, and protruding a tip of the contact plug covered by the insulating film from the second surface, and
exposing the tip of the contact plug by polishing a surface
of the insulating layer and removing the insulating film
covering the tip of the contact plug, through flattening
processing.
(19) The method according to (17), further including
forming an insulating layer covering a whole, after reducing a thickness of the semiconductor substrate by
performing etch back on the second surface, and protruding a tip of the contact plug covered by the insulating film from the second surface,
exposing the tip of the contact plug by forming an opening
in a region of the insulating layer, the region overlapping a region where the contact plug is formed, and
forming a low-resistance layer filling the opening.
It should be understood by those skilled in the art that
various modifications, combinations, sub-combinations, and
alterations may occur depending on design requirements and other factors insofar as they are within the scope of the appended claims or the equivalents thereof.

What is claimed is:

1. A semiconductor device comprising:
   a semiconductor substrate;
   a transistor at a first surface of the semiconductor substrate; and
   one or more contacts penetrating a part of the transistor and the semiconductor substrate, the contacts being insulated from the semiconductor substrate.

2. The semiconductor device according to claim 1, further comprising:
   a memory element on an oppositely facing second surface of the semiconductor substrate, and
   an insulating layer between the memory element and the semiconductor substrate.

3. The semiconductor device according to claim 2, wherein the memory element is a spin transfer torque-magnetic tunnel junction (STT-MTJ) element.

4. The semiconductor device according to claim 1, wherein the transistor includes a source electrode, a drain electrode, and a gate electrode.

5. The semiconductor device according to claim 1, further comprising a contact plug that extends through the semiconductor substrate from the first surface to the second surface.

6. The semiconductor device according to claim 5, wherein the contact plug extends beyond the first surface and the second surface.

7. The semiconductor device according to claim 5, wherein the contact plug is electrically connected to the transistor.

8. The semiconductor device according to claim 4, further comprising a channel region located below the gate electrode.

9. The semiconductor device according to claim 8, further comprising a gate insulating film located between the gate electrode and the channel region.

10. The semiconductor device according to claim 5, further comprising an insulating film insulating the contact plug from the semiconductor substrate.

11. The semiconductor device according to claim 5, further comprising an interlayer insulating layer extending over the surface of the semiconductor substrate.

12. The semiconductor device according to claim 5, wherein the contact plug tapers proceeding from the first surface to the second surface.

13. The semiconductor device according to claim 1, further comprising a tap region through which the layer of the semiconductor substrate also commonly extends.

14. The semiconductor device according to claim 1, wherein the wiring layer includes a plurality of layers.

15. The semiconductor device according to claim 2, further comprising a select line that connects to the memory element by means of a contact plug.

* * * * *